(12) United States Patent
Glass et al.

(10) Patent No.: US 11,296,079 B2
(45) Date of Patent: Apr. 5, 2022

(54) PMOS AND NMOS CONTACTS IN COMMON TRENCH

(71) Applicant: INTEL CORPORATION, Santa Clara, CA (US)

(72) Inventors: Glenn A. Glass, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 16/649,386

(22) PCT Filed: Dec. 28, 2017

(86) PCT No.: PCT/US2017/068661
§ 371 (c)(1),
(2) Date: Mar. 20, 2020

(87) PCT Pub. No.: WO2019/132910
PCT Pub. Date: Jul. 4, 2019

(65) Prior Publication Data
US 2020/0303373 A1 Sep. 24, 2020

(51) Int. Cl.
*H01L 27/088* (2006.01)
*H01L 29/205* (2006.01)
(Continued)

(52) U.S. Cl.
CPC .. *H01L 27/0886* (2013.01); *H01L 21/823871* (2013.01); *H01L 29/205* (2013.01);
(Continued)

(58) Field of Classification Search
CPC ............... H01L 27/0886; H01L 29/205; H01L 29/42392; H01L 29/785; H01L 29/78696;
(Continued)

(56) References Cited

U.S. PATENT DOCUMENTS 9,728,464 B2  8/2017  Glass et al.
9,812,524 B2  11/2017  Glass et al.
(Continued)

FOREIGN PATENT DOCUMENTS

KR  1020140095297 A  8/2014
WO  2016209220 A1  12/2016
WO  2019123910 A1  7/2019

OTHER PUBLICATIONS

International Search Report and Written Opinion received for PCT Application No. PCT/US2017/068661 dated Sep. 27, 2018. 15 pages.
(Continued)

*Primary Examiner* — Feifei Yeung Lopez
(74) *Attorney, Agent, or Firm* — Schwabe, Williamson & Wyatt P.C.

(57) ABSTRACT

Techniques are disclosed for using compositionally different contact materials for p-type and n-type source/drain regions on a common substrate. The different contact materials may be within a common source/drain contact trench, or in type-dedicated trenches. A given contact trench may span one or more fins and include one or more source/drain regions on which a corresponding contact structure is to be made. In an embodiment, an isolation structure between p-type and n-type fins is selective to the trench etch and therefore remains intact within the trench after the target source/drain regions have been exposed. In such cases, the isolation structure physically separates n-type source/drain regions from p-type source/drain regions. The contact structures on the different type source/drain regions may be shorted proximate the top of the isolation structure. Numerous material systems can be used for the channel and source/drain regions, including germanium, group III-V materials, and 2-D materials.

25 Claims, 9 Drawing Sheets

(51) Int. Cl.
H01L 29/423 (2006.01)
H01L 29/78 (2006.01)
H01L 29/786 (2006.01)
H01L 29/45 (2006.01)
H01L 29/40 (2006.01)
H01L 21/8238 (2006.01)

(52) U.S. Cl.
CPC ........ *H01L 29/40* (2013.01); *H01L 29/42392* (2013.01); *H01L 29/45* (2013.01); *H01L 29/785* (2013.01); *H01L 29/78696* (2013.01)

(58) Field of Classification Search
CPC .. H01L 29/45; H01L 21/823871; H01L 29/40
See application file for complete search history.

(56) References Cited

U.S. PATENT DOCUMENTS

| | | | |
|---|---|---|---|
| 9,831,306 B2 | 11/2017 | Webb et al. | |
| 2009/0020764 A1* | 1/2009 | Anderson | H01L 29/1606 257/77 |
| 2009/0090934 A1* | 4/2009 | Tezuka | H01L 29/78696 257/190 |
| 2011/0147840 A1 | 6/2011 | Cea et al. | |
| 2014/0054547 A1* | 2/2014 | Eneman | H01L 29/785 257/24 |
| 2014/0091279 A1* | 4/2014 | Kachian | H01L 29/66439 257/27 |
| 2015/0214059 A1 | 7/2015 | Bouche et al. | |
| 2016/0099342 A1* | 4/2016 | Basker | H01L 29/161 438/283 |
| 2016/0276343 A1* | 9/2016 | Yeo | H01L 27/0886 |
| 2017/0179130 A1 | 6/2017 | Lin et al. | |
| 2018/0068857 A1* | 3/2018 | Adusumilli | H01L 21/823807 |
| 2019/0067120 A1* | 2/2019 | Ching | H01L 29/7843 |

OTHER PUBLICATIONS

International Preliminary Report on Patentability dated Jun. 30, 2020 for International Patent Application No. PCT/US2017/068661, 11 pages.

Smedfors, Datarina, "Ohmic Contacts for High Temperature Integrated Circuits in Silicon Carbide", KTH School of Information and Communication Technology SE-164 40, Kista Sweden, Thesis Paper, Dec. 2014, 49 pages.

* cited by examiner

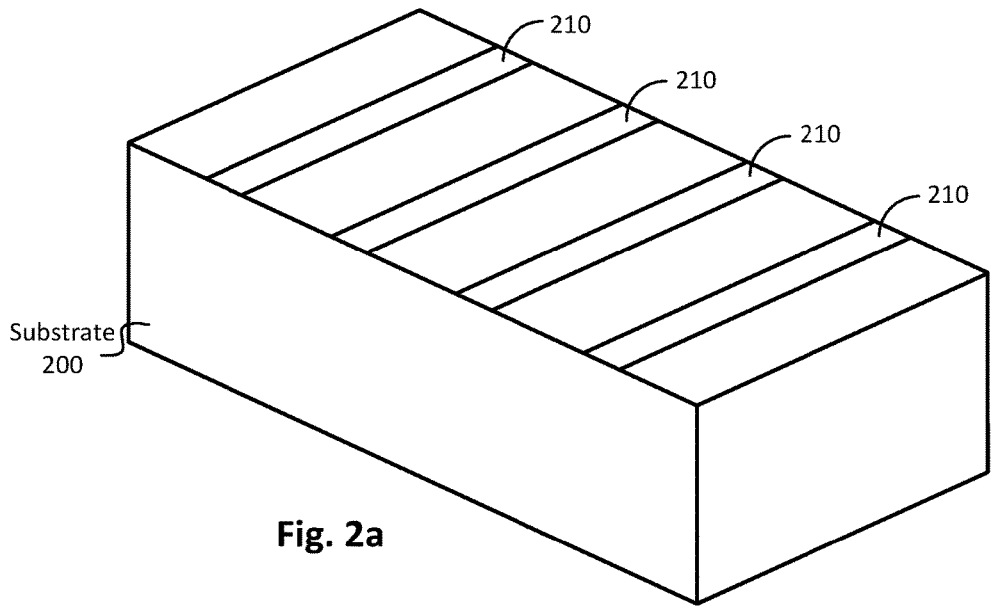
Fig. 2a
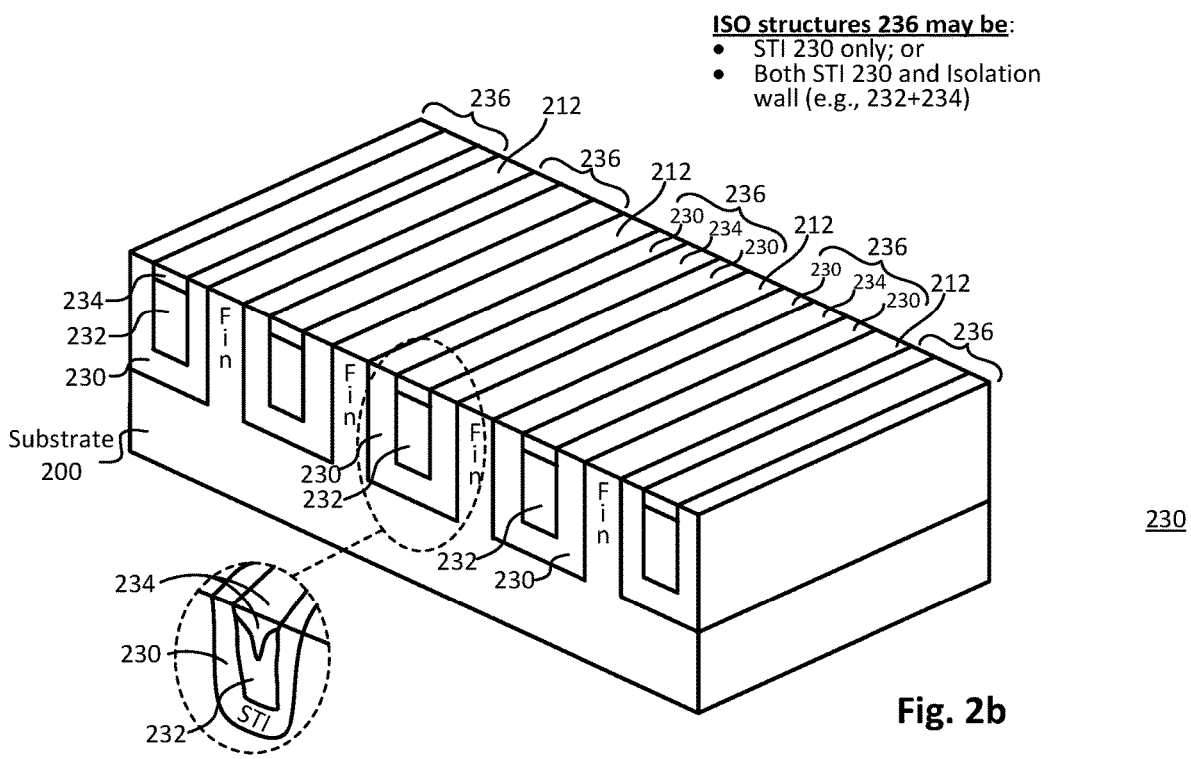
Fig. 2b
Fig. 2b'

Fin 422: Material #1
Fin 426: Material #2

PMOS AND NMOS CONTACTS IN COMMON TRENCH

BACKGROUND

CROSS-REFERENCE TO RELATED APPLICATIONS

This patent application is a U.S. National Phase Application under 35 U.S.C. § 371 of International Application No. PCT/US2017/068661, filed on Dec. 28, 2017, the entire contents of which is hereby incorporated by reference herein.

Increased performance of circuit devices including transistors, diodes, resistors, capacitors, and other passive and active electronic devices formed on a semiconductor substrate is typically a major factor considered during design, manufacture, and operation of those devices. For example, during the design and manufacture of metal oxide semiconductor transistor semiconductor devices, such as those used in complementary metal oxide semiconductor (CMOS) applications, it is often desired to minimize the parasitic resistance associated with contacts. Contact resistance is part of a given device's overall resistance, or so-called external resistance $R_{ext}$. Decreased $R_{ext}$ enables higher current from an otherwise equal transistor design.

BRIEF DESCRIPTION OF THE DRAWINGS

FIG. 2a is a perspective cross-sectional view showing a patterned hardmask layer for the formation of fins on a semiconductor substrate, in accordance with an embodiment of the present disclosure.

FIG. 2b is a perspective cross-sectional view showing the structure of FIG. 2a after shallow trench recess etching to form fins, deposition of shallow trench isolation material and isolation structures between the fins, and planarization, in accordance with an embodiment of the present disclosure. FIG. 2b' shows a specific example of how an isolation structure formed within shallow trench isolation might actually look, according to an embodiment of the present disclosure.

FIG. 2f' is a perspective cross-sectional view showing an alternate version of the structure of FIG. 2e, where the structure is further processed to provide a second set of replacement fins by repeating the masking (to isolate a target set of native fins), etching (to remove the target native fins), deposition (to replace the target native fins with replacement fins), and planarization and STI etch, as variously shown in FIGS. 2c-2f, thereby providing a second set of replacement fins, in accordance with an embodiment of the present disclosure. FIG. 2f' shows a multilayer replacement fin configuration that can be used, which is useful in making nanowire devices, according to some embodiments.

Figure 1:
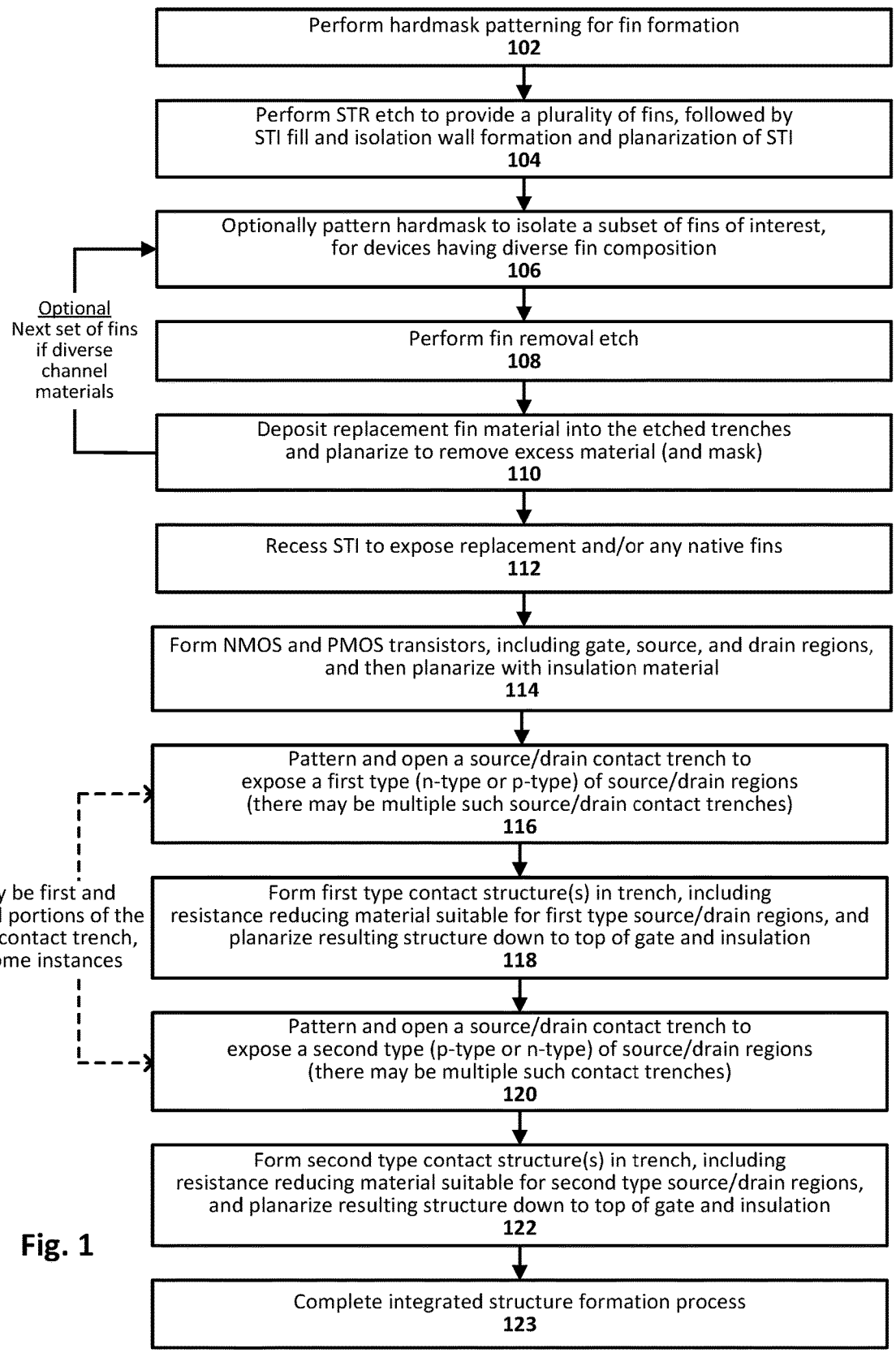
FIG. 1 illustrates a method for forming non-planar transistor structures having p-type contacts and n-type contacts in the same trench and/or dedicated trenches, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are disclosed for using different contact materials for p-type and n-type source/drain regions on a common substrate. The selection of contact materials can be tailored such that they are compatible with the desired polarity (p-type or n-type) of the underlying source/drain as well as the semiconductor material of that underlying source/drain region. In some cases, the different contact materials for p-type and n-type source/drain regions are within a common source/drain contact trench, although they may also be in dedicated trenches. A given contact trench may be span one or more fins and include one or more source/drain regions on which a contact structure is to be made. In an embodiment, an isolation structure between p-type and n-type fins is selective to the trench etch and therefore remains intact within the contact trench after the target source/drain regions have been exposed. In some such example embodiments, the isolation structure physically separates n-type epitaxial source/drain region materials from p-type epitaxial source/drain region materials. Note, however, that the metal contact structures formed on those physically separated epitaxial source/drain regions may be shorted to one another within a common trench, in some such embodiments. In a more general sense, there are at least two clearly distinguishable compositionally distinct source/drain contact materials (e.g., resistance reducing metals) above corresponding p-type and n-type source/drain transistor regions of a common semiconductor structure. Numerous configurations and material systems can be used for the transistor channel and source/drain regions, including silicon, germanium, group III-V materials, and 2-D materials, as will be appreciated in light of this disclosure.

General Overview

As previously explained, increased drive current in the transistors can be achieved by reducing device resistance. Contact resistance is one component of a device's overall resistance. A transistor contact stack for a silicon or silicon germanium (SiGe) source/drain region may include, for example, a nickel silicide layer, a titanium nitride adhesion layer, and a tungsten plug or pad. In some cases, a contact resistance lowering material may be placed between the semiconductor source/drain and plug metal. The contact resistance reducing material and other contact materials have historically been the same for both p-type and n-type transistor devices. However, as will be appreciated in light of this disclosure, there are benefits to optimizing the contact structure materials, particularly with respect to the resistance reducing material for a given type (n-type or p-type, or more generally, polarity). Furthermore, the task of optimizing a single resistance reducing material for both types of transistor is not trivial, and is particularly problematic or untenable when using a channel material other than silicon.

Thus, techniques are disclosed herein for using customized and different source/drain contact materials, such as elementally different resistance reducing materials for p-type and n-type transistor devices on a common substrate. In some embodiments, the channel and source/drain regions of the transistors include materials other than or in addition to silicon, such as germanium, group III-V semiconductor materials, and 2-D materials. A given source/drain contact trench may be formed over multiple fins and includes one or more source/drain regions on which a contact structure is to be made. In some cases, an isolation structure between p-type and n-type fins is selective to the trench etch and therefore remains intact within the contact trench, according to some embodiments. The contact deposition process then proceeds, with one of the p-type or n-type source/drain regions within the trench being blocked off while the other type source/drain regions are exposed so the corresponding contact structure can be formed thereon. Then, the other type source/drain regions are exposed and the corresponding contact structures are formed thereon. The isolation structure effectively physically separates the n-type source/drain semiconductor materials from the p-type source/drain semiconductor materials, even though the contact structures of that separate source/drain regions may be shorted together above the isolation wall. The p-type and n-type source/drain regions on which the contact structures are formed can have any number of configurations and doping schemes. Numerous material systems can be used for the channel and source/drain regions.

For instance, for germanium p-type metal oxide semiconductor (PMOS) transistors (germanium-containing channel), resistance reducing metals such as nickel, platinum, nickel platinum, cobalt, titanium, or a multilayer structure of titanium and titanium nitride all have good contact resistance. A metal plug material can then be provided on the resistance reducing layer, such as tungsten, aluminum, ruthenium, cobalt, or copper or a combination of such metals. In some such example embodiments, the corresponding channel region is germanium or germanium-rich (e.g., germanium concentration of about 70 to 100 atomic percent), and the source drain regions are germanium, SiGe, SiGe:C (meaning SiGe alloyed with carbon at concentration of about 8% or lower), or other germanium-rich material having a germanium concentration in excess of about 70 atomic percent. In some such embodiments, the source/drain region on which the contact structure is formed includes a body of semiconductor material such as germanium or SiGe or SiGe:C, while in other embodiments includes a multilayer structure, such as a relatively thin layer of SiGe or SiGe:C (e.g., about 5 to 10 nm thick) and a germanium or germanium-rich cap thereon. In some such cases, the different layers of the multilayer structure may be compositionally the same but have different doping concentrations, or be different compositionally as well. In any such cases, any portion of the source/drain region can be graded, to facilitate proper lattice matching with respect to the underlying layers and/or channel region. In addition, the source/drain regions can be doped with a p-type impurity of, for instance, boron, gallium, or aluminum, at a suitably high concentration (e.g., in excess of about 1E18 $cm^3$). In any such cases, and according to an embodiment, a relatively thin layer of p-type resistance reducing material is provided over source/drain regions in the contact trench, such as a layer of cobalt (or other p-type resistance reducing materials such as titanium, nickel, platinum, and alloys thereof, for example) having a thickness in the range of about 1 to 10 nm, and a relatively thicker plug metal (e.g., tungsten or aluminum) is deposited on the resistance reducing layer, at a thickness of about 20 to 50 nm. The dimensions and concentrations provided are for example purposes only, and are not intended to limit the spirit and scope of this disclosure, as will be appreciated.

For germanium n-type metal oxide semiconductor (NMOS) transistors (germanium-containing channel), p-type resistance reducing metals (e.g., nickel, platinum, nickel platinum, cobalt, titanium, or multilayer structure of titanium and titanium nitride) or germanides are relatively poor choices due to large barrier heights of more than 0.5 eV. So, for germanium-containing NMOS devices, a resistance reducing material that has a depinning effect is deposited onto the source/drain region, such as antimony, indium antimonide, indium arsenic, or scandium. A thin insulator (e.g., silicon dioxide) may also be incorporated to facilitate this depinning and is deposited onto the resistance reducing material, followed by a relatively thicker plug material (e.g., tungsten, aluminum, ruthenium, cobalt, or copper or a combination of such metals). In some such example embodiments, the channel region is germanium or germanium-rich (e.g., germanium concentration of about 70 to 100 atomic percent), and the source drain regions are silicon, SiGe, or other silicon-rich material having a silicon concentration in excess of about 70 atomic percent. In some such embodiments, the source/drain region on which the contact structure is formed includes a body of semiconductor material such as silicon, or SiGe, while in other embodiments includes a multilayer structure, such as a relatively thin layer of SiGe (e.g., about 5 to 10 nm thick) and a silicon cap thereon. In some such cases, the different layers of the multilayer structure may be compositionally the same but have different doping concentrations, or be different compositionally as well. In any such cases, any portion of the source/drain region can be graded, to facilitate proper lattice matching with respect to the underlying layers and/or channel region. In addition, the source/drain regions can be doped with a n-type impurity of, for instance, phosphor or silicon, at a suitably high concentration (e.g., in excess of 1E18 cm$^3$). In any such cases, and according to an embodiment, a relatively thin layer of n-type resistance reducing material is provided over source/drain regions in the contact trench, such as a layer of antimony (or other n-type depinning materials such as indium antimonide, indium arsenic, or scandium) having a thickness in the range of about 1 to 10 nm. A relatively thin layer of insulator, such as silicon dioxide, is then deposited onto the resistance reducing material with a thickness in the range of about 1 to 10 nm, followed by a relatively thicker plug metal (e.g., tungsten or aluminum) on the resistance reducing layer, at a thickness of about 20 to 50 nm. As previously noted, the dimensions and concentrations provided are for example purposes only, and are not intended to limit the spirit and scope of this disclosure.

Group III-V semiconductor materials are more amenable to NMOS transistors, which might be paired, for example, with germanium PMOS transistors of a given CMOS integrated circuit. So, for group III-V semiconductor material NMOS devices, a resistance reducing material such as germanium, nickel, germanium-gold alloy, gold, platinum, and titanium can be used. A metal plug material can then be provided on the resistance reducing layer, such as tungsten, aluminum, ruthenium, cobalt, or copper or a combination of such metals. In some such example embodiments, the channel region includes some compound of indium, gallium, arsenic, and/or antimony (e.g., $In_xGa_{1-x}As$ where $0.51 \leq x \leq 0.55$, indium arsenide, gallium nitride, or gallium antimonide), and the source drain regions include are a compound comprising any combination of indium, aluminum, arsenic, phosphor, gallium, and antimony (e.g., $In_yAl_{1-y}As$ where $0.60 \leq y \leq 1.00$, $InAs_yP_{1-y}$ where $0.10 \leq y \leq 1.00$, $In_yGa_{1-y}As_zP_{1-z}$ where $0.25 \leq y \leq 1.00$ and $0.50 \leq z \leq 1.00$, $GaSb$, $Ga_xAl_{1-x}Sb$ where $0.01 \leq x \leq 0.20$, $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). In some such embodiments, the source/drain region on which the contact structure is formed includes a body of group III-V semiconductor material, while in other embodiments includes a multilayer structure, such as a relatively thin layer of a first group III-V material (e.g., about 5 to 10 nm thick) and a second group III-V material cap thereon. In some such cases, the different layers of the multilayer structure may be compositionally the same but have different doping concentrations, or be different compositionally as well. In any such cases, any portion of the source/drain region can be graded, to facilitate proper lattice matching with respect to the underlying layers and/or channel region. In addition, the source/drain regions can be doped with a n-type impurity of, for instance, magnesium or silicon, at a suitably high concentration (e.g., in excess of 1E18 cm$^3$). Again, the dimensions and concentrations provided are for example purposes only.

In some embodiments, exposure of a given PMOS germanium-containing region to the etch chemistry of the NMOS group III-V material-containing region could be toxic to the PMOS region, and vice versa. Likewise, the group III-V semiconductor material itself could lead to unintentional doping of the PMOS region. For example, arsenic from an indium arsenide feature or phosphor from indium phosphide feature (both from the group III-V NMOS region) could unintentionally n-type dope adjacent germanium PMOS regions (which are intended to be doped p-type). In these cases, the source/drain regions for the NMOS and PMOS regions should not be simultaneously exposed due to this cross-doping risk, as will be appreciated.

For two-dimensional transistors (channels containing graphene and/or transition metal dichalcogenides), similar resistance reducing materials can be used for both PMOS and NMOS transistors, such as nickel, titanium, gold, silver, aluminum, scandium, yttrium, zirconium, and platinum. In some embodiments, however, one of these can be used on p-type source/drain regions and another different one can be used on n-type source/drain regions. The same notion applies to other materials systems provided herein that can use similar resistance reducing materials for both PMOS and NMOS transistors. A metal plug material can then be provided on the resistance reducing layer, such as tungsten, aluminum, ruthenium, cobalt, or copper or a combination of such metals. Transition metal dichalcogenides (sometimes referred to as TMDs) are semiconductors of the type MX2, where M is a transition metal (such as molybdenum or tungsten) and X is a chalcogen (such as sulfur, selenium or tellurium). Molybdenum disulfide ($MoS_2$) is one example TMD, although others may be used as well. In some example embodiments, the channel region is graphene or $MoS_2$, and the source drain regions may be the same material, or a different material. In some such embodiments, the source/drain region on which the contact structure is formed includes a body of semiconductor material, while in other embodiments includes a multilayer structure, as previously explained, and the previous relevant discussion is equally applicable here. In any such cases, any portion of the source/drain region can be graded, to facilitate proper lattice matching with respect to the underlying layers and/or channel region. A doping scheme can be implemented as desired. In addition, note that TMDs, graphene, or other two-dimensional materials have a similar set of concerns (with respect to contamination and cross-doping) when being paired with PMOS materials, as previously explained with respect to group III-V materials, and that previous relevant discussion is equally applicable here.

In any of these example material system cases, a structure can be fabricated where some or all source/drain contact trenches have regions that are filled with PMOS metals on p-type source/drain regions and NMOS metals on n-type source/drain regions. In some embodiments, these diverse or otherwise distinct contact metals can be deposited into the same contact trench (at different times in the contact formation process), while in other embodiments a design rule can be set that all source/drain regions can be dedicated as NMOS only and PMOS only. In the latter case, a given contact trench would only have one type of contact materials. Nevertheless, the contact materials in PMOS trenches would differ from that in NMOS trenches. As will be appreciated, however, while this design may be more robust to yield issues, the layout restrictions may consume valuable space. In any such embodiments, note that diverse contact materials can be seen using cross-sectional composition mapping. For instance, transmission electron microscopy (TEM) cross section or secondary ion mass spectrometry (SIMS) profile can be used to show the diverse contact materials in a common trench, according to some embodiments. In some such cases, the contact structures within the trench may be shorted together, despite the underlying source/drain regions being separated by the intervening isolation wall. The polarity, material systems, and contact material types can be configured to any number of configurations, and the present disclosure is not intended to be limited to any particular ones, as will be appreciated.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Methodology and Architecture

FIG. 1 illustrates a method for forming non-planar transistor structures having p-type contacts and n-type contacts in the same trench and/or dedicated trenches, in accordance with an embodiment of the present disclosure. Reference is made to FIGS. 2a-2f and 3a-3d for example structures resulting from the process. As can be seen, this example process employs a recess and replace technique in forming at least some of the fins (and channel materials), which in turn yields fin structures that are distinct from the underlying substrate. However, as will be appreciated, the techniques can be equally applied to fins that are all native (i.e., part of or otherwise the same material as) the underlying substrate.

The method of this example embodiment commences at 102 with performing hardmask patterning for fin formation, on a given substrate. FIG. 2a shows an example substrate 200, after this patterning, with the resulting hardmask 210. Any number of suitable substrate configurations can be used here, including bulk substrates, semiconductor-on-insulator substrates (XOI, where X is a semiconductor material such as Si, Ge or Ge-enriched Si), and multi-layered structures. In a more general sense, any substrate upon which fins can be formed prior to a subsequent transistor formation process can be used. In one specific example case, the substrate 200 is a bulk silicon substrate. The hardmask 210 can be provisioned on substrate 200 using any number of suitable processes as normally done. For instance, in some embodiments, hardmask 210 can be provided using standard photolithography, including deposition of or more hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned hardmask 210. Any number of suitable mask configurations can be used, as will be apparent.

With further reference to FIG. 1, the method then continues at 104 with performing a shallow trench recess (STR) etch process to provide a plurality of fins, followed by shallow trench isolation (STI) fill and isolation wall formation, and planarization of STI. As will be explained in turn, the isolation walls etch at a relatively slower rate than the STI fill, which allows the isolation walls to remain in the later-formed contact trenches, in some embodiments. The isolation walls can be used to physically separate different source/drain region materials of neighboring transistor devices, if so desired. FIG. 2b illustrates an example of the resulting structure, according to one embodiment.

Any number of fins 212 can be provided, and in any desired pattern or configuration suitable for a given application. The shallow trench etch can be accomplished, for example, with standard photolithography including wet or dry etching, or a combination of etches. The geometry of the trenches (width, depth, shape, etc) can vary from one embodiment to the next as will be appreciated, and the present disclosure is not intended to be limited to any particular trench geometry. In one specific example embodiment having a bulk silicon substrate 200 and a silicon nitride hardmask 210, a dry etch is used to form the trenches that are about, for instance, 100 Å to 5000 Å below the initial top surface of the substrate. Any number of trench configurations can be used depending on the desired fin height, as will be apparent.

The shallow trenches between the fins are subsequently filled with one or more insulating materials so as to provide isolation (ISO) structures 236 between fins 212, in accordance with an embodiment. As can be seen, there are two types of ISO structures 236 in this example embodiment, the two types including a first type of STI 230 only, and a second type of STI 230 and an isolation wall that includes low etch rate material 232 and an etch resistant cap 234. In the example shown, there are two isolation walls, but any number of configurations can be used. To this end, note that an isolation wall can be between every fin or just some of the fins. For instance, an isolation wall can be between every fin, or every two fins, or every three fins, etc. In other embodiments, the isolation walls may be formed in an irregular or otherwise non-repeating pattern. In a more general sense, the isolation walls can be provided wherever there is a need for isolation between neighboring fins, in a given integrated circuit layout. The ISO structures 236 can be provided using any number of suitable deposition processes, but in one embodiment are provided using a conformal deposition process such as atomic layer deposition (ALD) followed by a planarization process.

In one specific example embodiment having a silicon substrate 200, the structures 236 that include only STI 230 are $SiO_2$, and the structures 236 that include both STI 230 and an isolation wall comprise $SiO_2$ (for STI 230), silicon nitride (for low etch rate material 232), and hafnium oxide (for the etch resistant cap 234). Other embodiments may use any number of other suitable isolation insulator materials. For instance, and in general, the STI 230 material can be the native oxide of the substrate 200 material, or some other oxide insulator. The low etch rate material 232 can be any material having a lower etch rate than the STI 230 material (e.g., such as nitride or carbide, which tend to have relatively much lower etch rates than oxides, such as 3× or more lower for a given etch scheme). The etch resistant cap 234 further supports a low etch rate and can be, for instance, an oxide, nitride, or carbide employing any common metal, such as titanium, hafnium, aluminum, scandium, yttrium, zirconium, niobium, ruthenium, tantalum, lanthanum, and lutetium. In general, the etch resistant cap 234 should have relatively high resistivity (comparable to an insulator). In any such cases, note that the materials making up ISO structures 236 can be provided via ALD to provide a conformal or otherwise relatively uniform deposition. Using such a conformal deposition process, note that the isolation walls are effectively self-aligned within the corresponding body of STI 230 material. FIG. 2b' shows how an example ISO structure 236 that includes both STI 230 and an isolation wall might look, as a result of using a conformal deposition process, according to one embodiment. In one example embodiment, STI 230 (insulator oxide) is conformally deposited to a certain thickness (e.g., 10 to 50 nm), followed by conformal deposition of the etch resistant material 232 (insulator nitride), such that in areas between fins or groups of fins, the etch resistant material 232 material closes the remaining gap between the STI 230 material and pinches off on itself. The etch resistance cap 234 is then conformally deposited. Most of the etch resistant cap is then planarized off such that only the regions in the pinched off neck of nitride or other etch resistant material 232 remain. Other deposition techniques such as chemical vapor deposition (CVD) and physical vapor deposition (PVD) can be used as well, but may necessitate an alignment aspect to the forming process for ISO structures 236, as will be appreciated.

Note that the STI trenches may be circular or polygonal in nature, and any reference to trench 'sides' is intended to refer to any such configurations, and should not be interpreted to imply a particular geometric shaped structure. FIG. 2*b* further demonstrates how the ISO structures 236 can be planarized using, for example, chemical mechanical planarization (CMP) or other suitable process capable of planarizing the structure. In the example embodiment shown, the hardmask 210 over the native fins 212 is completely removed during this planarization process. Other embodiments may utilize a selective planarization configured to leave a portion of the mask in place, which can be used in subsequent processing.

While the illustrated embodiment shows fins 212 as having a width that does not vary with distance from the substrate 200, the fins 212 may be tapered such that they are narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins 212 are illustrated as all having the same width, some fins may be wider and/or otherwise shaped differently than others. For example, in an embodiment, fins to be used in the creation of NMOS transistors may be narrower than fins to be used in the creation of PMOS transistors, or vice-versa. In some embodiments, for example, the fin width can be less than 50 nm, or less than 40 nm, or less than 30 nm, or less than 20 nm, or less than 10 nm. In a more general sense, the fins can be patterned to have widths that are much narrower relative to, for instance, planar transistor technologies even for the same process node.

Figure 2C:
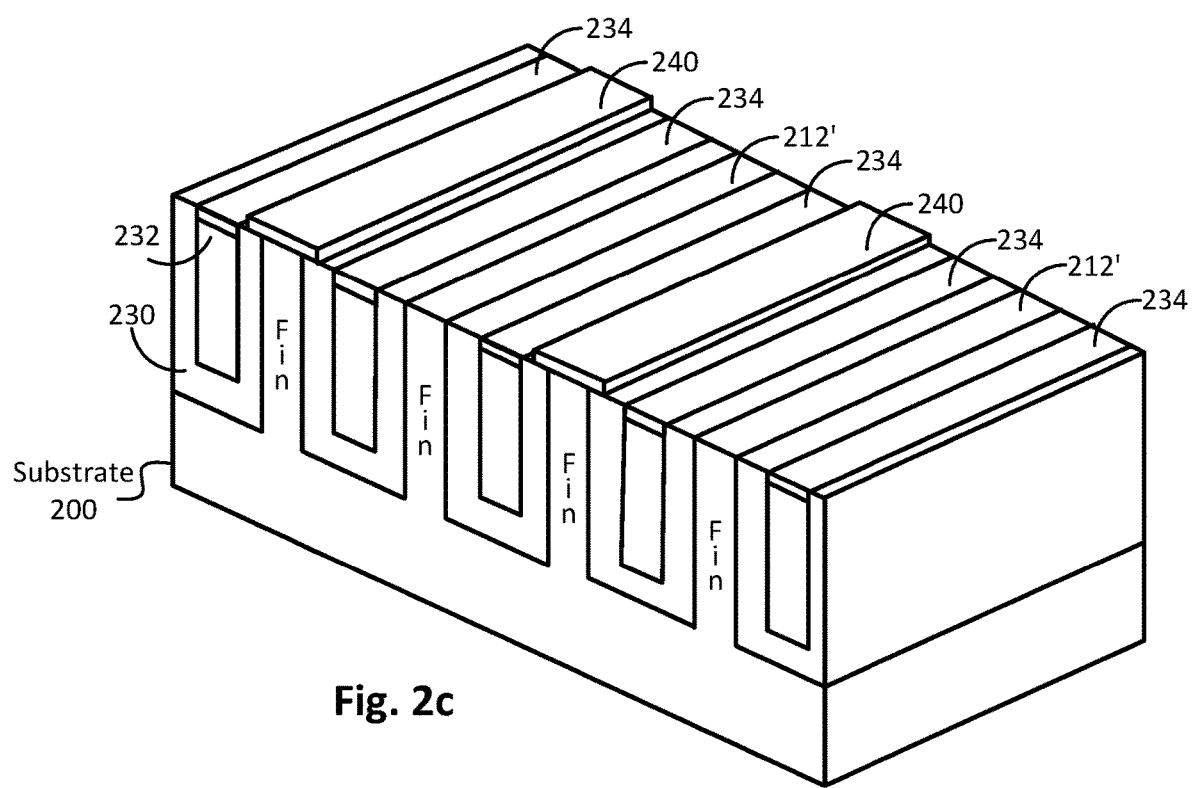
FIG. 2c is a perspective cross-sectional view showing the structure of FIG. 2b after isolating (using a mask) a first set of fins to be replaced in applications where diverse channel materials are desired, in accordance with an embodiment of the present disclosure.

With further reference to FIG. 1, the method continues at 106 with optionally patterning a hardmask to isolate a subset of fins of interest, for devices having diverse fin composition. As will be appreciated, if all the fins 212 are to be replaced with the same material, then this optional masking process can be omitted. FIG. 2*c* illustrates an example resulting structure wherein some of the fins are masked off with mask 240 and others are left unmasked so they can be removed or otherwise recessed, in accordance with an embodiment. In this example case, there are four fins shown, with two being masked and two unmasked, in an alternating manner (e.g., unmasked, masked, unmasked, masked). The mask 240 can be, for example, provisioned anew or left intact from the fin forming process as previously described. In any case, the mask 240 can be any suitable material that will withstand the recess etch of the unmasked fins 212' and subsequent epitaxial processing to fill those recesses.

Figure 2D:
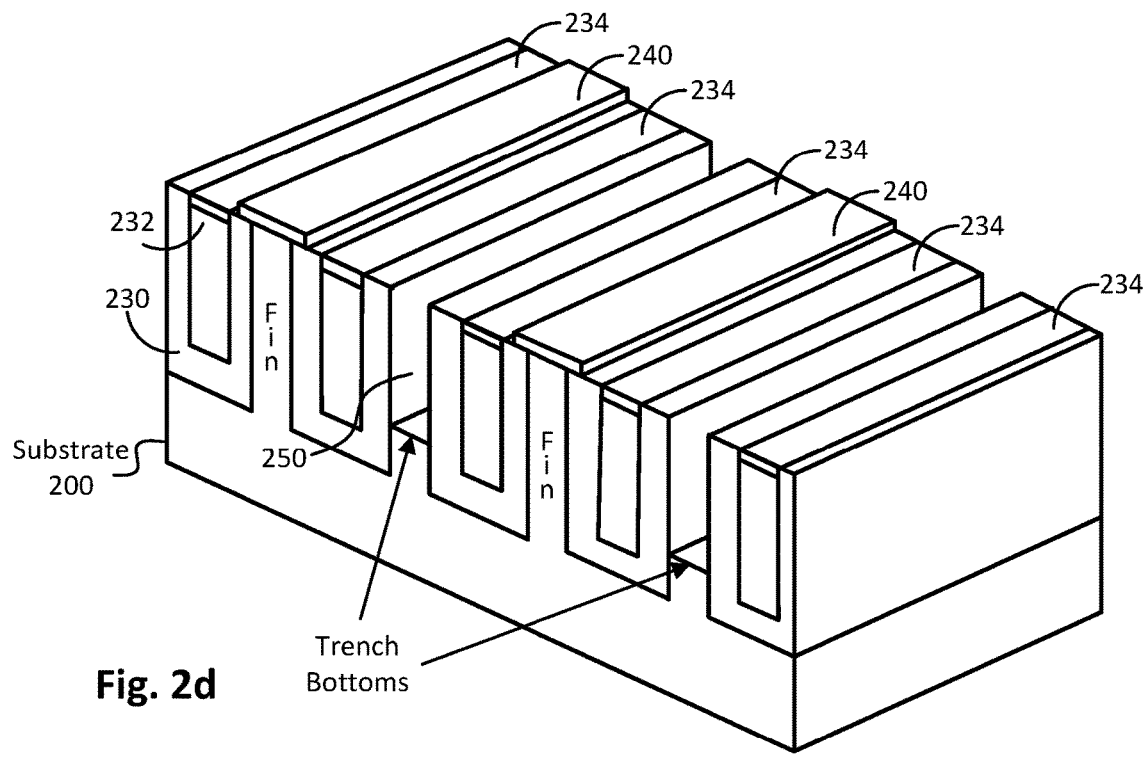
FIG. 2d is a perspective cross-sectional view showing the structure of FIG. 2c after the isolated fins have been removed by way of an etch process, in accordance with an embodiment of the present disclosure.

With further reference to FIG. 1, the method then continues at 108 with performing a fin removal etch. FIG. 2*d* shows an example resulting structure, according to one embodiment. Note the recessed fins and newly formed trenches 250. Any suitable etch scheme can be used to recess the fins. In some embodiments, standard wet and/or dry etches are used to a point so as to remove a bulk of the targeted material, but then low power dry plasma and/or low concentration NH$_4$OH wet etch can be used to fine tune the trench bottom morphology to a non-faceted low-ion damage surface upon which the replacement fin material can be grown or otherwise deposited, so as to provide a hybrid etch scheme. Table 1 illustrates example dry etch process parameters that can be used to remove silicon fins so as to provide trenches having non-faceted low-ion damage bottoms, according to some example embodiments.

TABLE 1

Example process parameters for dry Si etch

| Parameter | Range |
| --- | --- |
| Temperature (° C.) | 25 to 300 |
| Pressure (mT) | 10 to 100 |
| Flow Rate (sccm) | 1 to 60 of NF$_3$ and 50 to 1000 Ar |
| Duration (sec) | 20 to 100 |
| Power (W) | 25 to 2000 CW or up to 3000 pulsed |

As will be appreciated, continuous wave or CW is synonymous with 100% duty cycle meaning that the plasma is "on" the entire duration. The alternate to CW plasma is pulsed plasma where the power turns on and off with some frequency to make the plasma less energetic. Table 2 illustrates example wet etch process parameters that can be used to remove silicon fins so as to provide trenches having non-faceted low-ion damage bottoms, according to some example embodiments.

TABLE 2

Example process parameters for wet Si etch

| Parameter | Range |
| --- | --- |
| Temperature (° C.) | 20 to 30 |
| NH$_4$OH concentration in water (%) | 1 to 5 |
| Duration (sec) | 120 to 400 |

Note that the recess etch at 108 can be a selective etch such that it will remove the unmasked fin material but none or relatively little of the ISO structures 236 or mask 240. In such a case, note that the mask material 240 may also be implemented with the STI material (e.g., silicon dioxide, silicon nitride) or any other material resistant to the fin recess etch scheme. In one specific example embodiment, the fins 212 are silicon and the mask 240 is silicon dioxide and/or silicon nitride, and the initial recess etch is carried out using a wet etch (e.g., potassium hydroxide or other suitable etchant that will remove the unmasked silicon fin 212 material but not the STI 230 material), followed by at least one of the low power dry plasma and low concentration NH$_4$OH wet etches to remove any faceting and ion damage so as to fine tune the bottom morphology of trenches 250. The depth of the fin etch can vary from one embodiment to the next, and may leave a pedestal (as shown in FIG. 2*d*), or a recess into the substrate past the original fin bottom (effectively, the mirror image of a pedestal, across the x-axis), or flush with the bottom of the STI 230 trench. As will be further appreciated, the depth of the fin recess will depend on factors such as the desired channel configuration and material, substrate thickness, and/or fin height. In some embodiments, the etching process may alter the width of recesses 250, with the top of the trench 250 being wider than the bottom in some such cases. In another embodiment where the original native fin 212 was wider at the bottom than the top, the top of trench 250 may be widened to be closer to or exceed the width at the trench bottom. In yet another embodiment, the recess 250 may end up with a slightly hourglass shape, wider at the top and bottom than in the middle. In yet another embodiment, the width may be substantially unchanged by the etching process. In a more general sense, the shape of the recesses 250 may be changed by the etching process (to make wider) or a deposition onto sidewalls of the trench (to make narrower), which may in turn may change the shape of the diffusion area (or portions thereof) formed later in the method at 110.

Figure 2E:
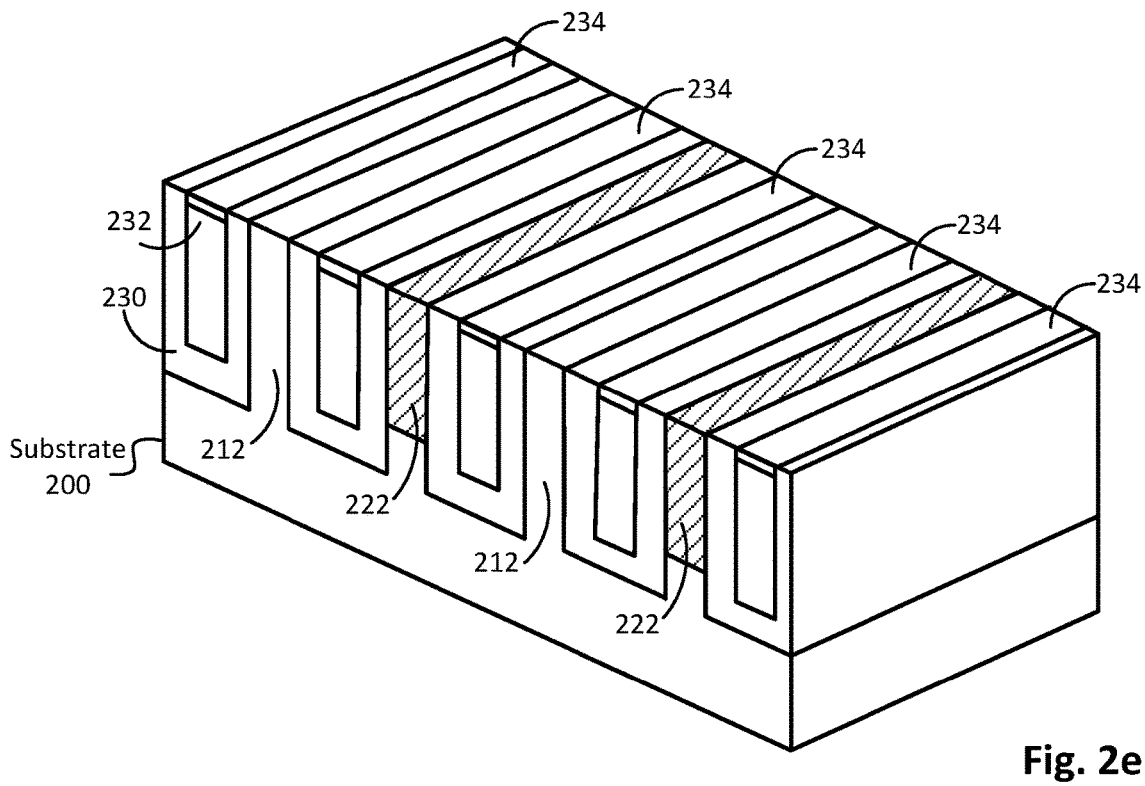
FIG. 2e is a perspective cross-sectional view showing the structure of FIG. 2d after the removed fin material has been replaced with the desired replacement material, in accordance with an embodiment of the present disclosure.

With further reference to FIG. 1, method continues at 110 with depositing replacement fin material into the etched trenches, followed by planarization to remove any excess materials. FIG. 2e shows an example resulting structure after deposition of channel material 222, and planarization, according to an embodiment. As can be seen in this example case, the trenches 250 have been filled by way of epitaxial growth with a particular semiconductor material, alloy or compound (e.g., germanium-containing materials, group III-V semiconductor materials, 2-D semiconductor materials). The epitaxial material can be configured as desired with respect to any number of parameters of interest, such as layer thickness, polarity, doping, composition and/or strain. Note that the epitaxial deposition may result in some excess material that extends from the surface of STI 230 and may be misshapen, faceted, or irregular. Such excess material can be removed by planarization at 110 and as further shown in FIG. 2e, so that the resulting replacement fins 222 are co-planar with the STI 230 and isolation walls. Further note that, in some embodiments, the planarization process can also be used to remove the mask 240 from the remaining fins 212, to facilitate their subsequent processing. In some example configurations, replacement fins 222 can be, for example, an epitaxial growth of SiGe alloy of arbitrary composition, germanium, germanium-tin alloy of arbitrary composition, or any other semiconductor material, alloy or compound suitable for a given application or otherwise desired. Any suitable deposition techniques such as chemical vapor deposition (CVD), rapid thermal CVD (RT-CVD), and gas-source molecular beam epitaxy (GS-MBE) can be used to provide the replacement fin material, and numerous suitable semiconductor materials and alloys thereof can be used, as will be appreciated. In one specific embodiment, the substrate 200 is a bulk silicon substrate and the replacement fins 222 are SiGe having a germanium concentration in excess of 70 atomic percent. In another specific embodiment, the substrate 200 is a bulk silicon substrate and the replacement fins 222 are bulk germanium, possibly with a relatively thin intervening graded SiGe buffer to transition from the silicon substrate to the bulk germanium portion. In another specific embodiment, the substrate 200 is a bulk silicon substrate and the replacement fins 222 are $In_xGa_{1-x}As$ where $0.51 \leq x \leq 0.55$. In another specific embodiment, the substrate 200 is a bulk silicon substrate and the replacement fins 222 are $MoS_2$. In another specific embodiment, the substrate 200 is a bulk silicon substrate and the replacement fins 222 are graphene. Numerous other possible configurations will be apparent.

With further reference to FIG. 1, recall that one or more additional sets of replacement fins different than the first set can be provided, in some embodiments. In such cases, the method can repeat processing from 106 through 110 as needed to provide one or more additional sets of replacement fins. Any number of replacement fin sets can be formed, as will be appreciated. Likewise, some of the fins may be left in their native state (e.g., silicon fins of a silicon substrate) rather than replaced. In a more general sense, any arbitrary number of replacement fin types and/or fin configurations can be implemented with or without original fins, as will be appreciated in light of this disclosure. Numerous fin configurations, including fins configured with one or more nanowire layers, can be used. Example semiconductor trench-based replacement fin forming techniques are provided, for instance, in U.S. Pat. No. 9,728,464. In some such cases, the replacement fin material is provided as alternating layers of desired channel material and sacrificial/inactive material such as described in U.S. Pat. No. 9,812,524. Such multilayer fins are particularly useful for forming nanowire transistors (e.g., where the sacrificial/inactive material is removed during final gate processing, prior to deposition of final gate materials, so as to liberate or ribbonize the channel material). Any number of fin forming processes can be used in the context of the present disclosure, as will be appreciated. In one example embodiment, replacement fins provided in the p-channel portion of the integrated circuit structure are germanium or SiGe having a germanium concentration in excess of 70 atomic percent, and replacement fins provided in the n-channel portion of the integrated circuit structure are indium gallium arsenide (InGaAs). Note that the order of p and n channel processing may primarily depend, for example, on factors such as acceptable thermal budget considerations, toxicity of the etch chemistry of one material system (e.g., n-type) to the other material system (e.g., p-type), and the potential for unintended doping of one material system by another material system. Further recall that the replacement material trenches may have a non-faceted bottom, or not, or some combination of faceted and non-faceted trench bottoms. For example, group III-V semiconductor material trenches may actually prefer a faceted trench bottom, while group IV semiconductor materials (e.g., germanium, silicon, SiGe, SiGe:C, etc) may prefer a non-faceted low-ion damage trench bottom, according to some embodiments. Numerous configurations providing channel diversity and relatively high channel mobility will further be apparent in light of this disclosure. Yet in still other embodiments, the channels may be all the same material, and that material may be native to the substrate, such as the example case employing a bulk silicon substrate having silicon fins (and channel regions) for both n-type and p-type transistors, along with p-type source/drain region structures and corresponding p-type contact structures, and n-type source/drain region structures and corresponding n-type contact structures different from the p-type contact structures.

Figure 2F:
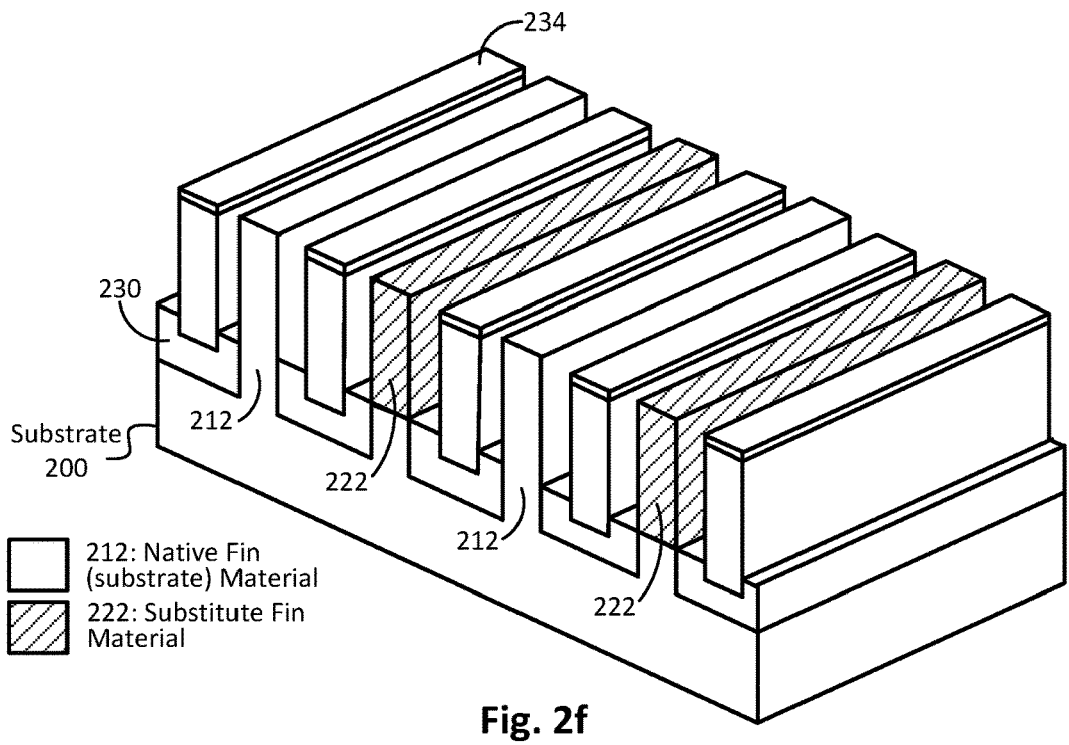
FIG. 2f is a perspective cross-sectional view showing the structure of FIG. 2e after planarization to remove excess replacement fin material and the mask on the other fins, and after a shallow trench isolation (STI) etch to expose both the native fins and the replacement fins, in accordance with an embodiment of the present disclosure.
Figure 2F:
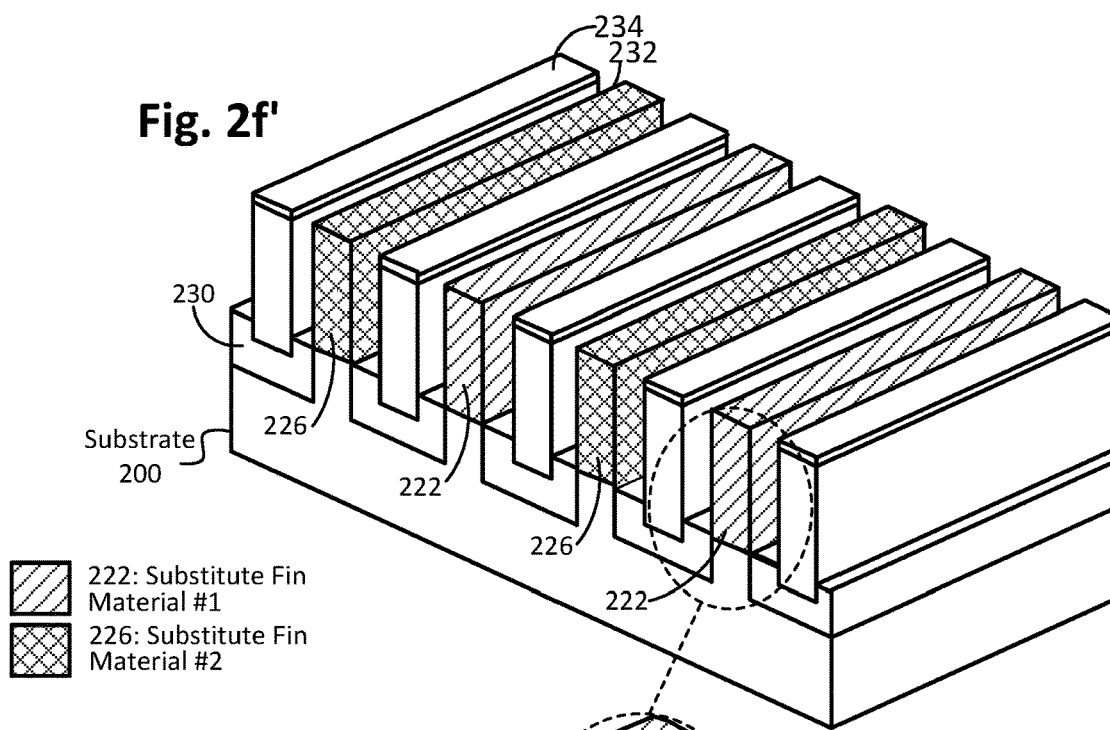
Figure 2F:
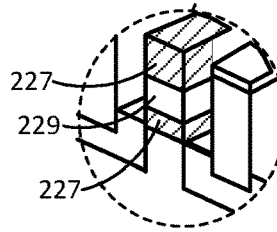

With further reference to FIG. 1, the method then continues at 112 with recessing the STI 230 to expose replacement fins (if any) and/or native fins (if any). FIG. 2f shows the resulting structure according to one embodiment, where the exposed fins include native fins 212 and replacement fins 222. In one such case, the replacement fins 222 can be p-type fins and the native fins can be n-type fins, or vice-versa. FIG. 2f shows the resulting structure according to another embodiment, where the exposed fins include a first type of replacement fins 222 and a second type of replacement fins 226. FIG. 2f shows the resulting structure according to yet another embodiment, where the exposed fins include one or more replacement fins that include alternating layers of active material 227 (e.g., Ge or Ge-rich SiGe for nanowires) and an inactive/sacrificial material 229 (e.g., silicon). In still other embodiments, additional replacement fin types and/or configurations (e.g., third type, etc) are included in the mix of exposed fins. In still other embodiments, all of the exposed fins are native fins (part of an underlying bulk substrate or layer). The STI recess can be carried out, for example, by masking the replacement and/or native fins and etching the STI 230 to a suitable depth, or without a mask by using a selective etch scheme (selective to the fins).

In any such cases, note the isolation walls (232 and 234) remain substantially intact after the STI recess process, and are useful in physically separating neighboring source/drain regions. Any suitable etch process (e.g., wet and/or dry) can be used. For instance, in one specific example embodiment, wherein the STI 230 is implemented with silicon dioxide and each of the native fins 212 is implemented with silicon and each of the replacement fins 222 is implemented with Ge-rich SiGe, the STI recess process is carried out using an etchant that is selective to the fin and isolation wall materials (doesn't etch the fin and isolation wall materials or otherwise etches the fin and isolation wall materials at a rate that is 3× or more slower than the STI material). As will be appreciated, a mask that is impervious or otherwise suitably resistant to the STI etchant can be patterned to protect the fins, if necessary. The etch resistant cap 234 can be used to protect the isolation walls (along with the etch resistant material 232), as previously explained. The depth of the STI recess can vary from one embodiment to the next, and in this example embodiment is flush with the top of the remaining fin stub (or pedestal). The depth of the STI recess will depend on factors such as the desired diffusion geometry, STI thickness and desired isolation, gate height, and/or fin height. In various embodiments, this partial removal of STI 230 may alter the width of one or more of the fins (212, 222, and/or 226) with the top of the fins ending up relatively narrower than the bottom of the fins in an embodiment. In other embodiments, the widths of the fins may remain relatively unchanged. In still other embodiments, replacement fins 222 and/or 226 may have their width changed more than the native fins 212, or vice-versa.

Figure 3A:
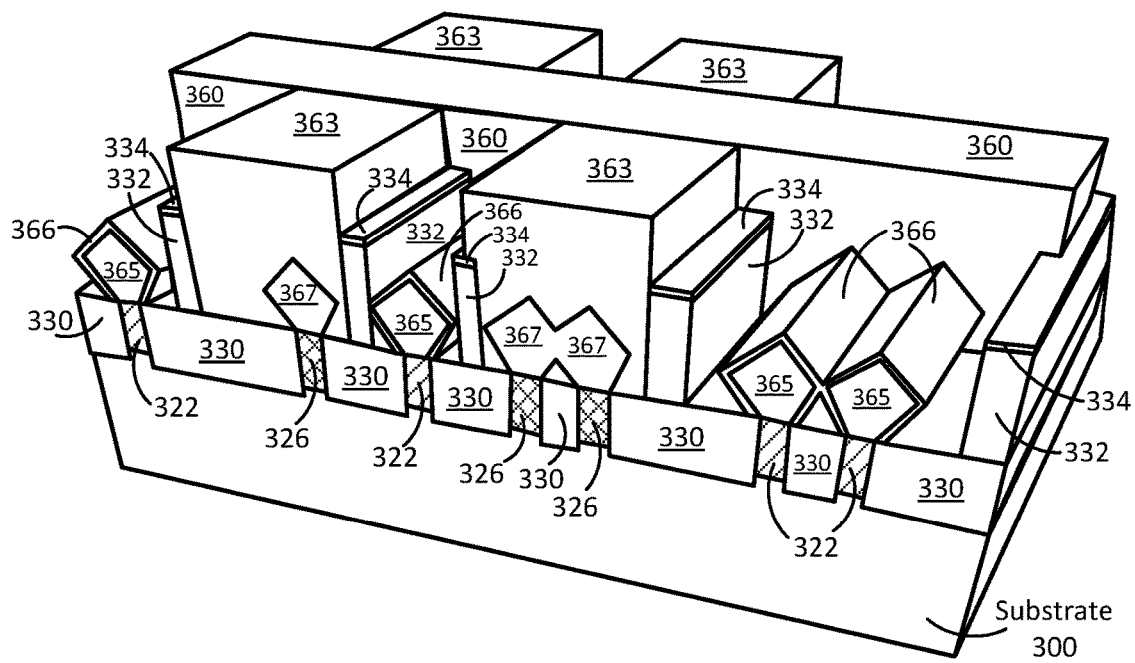
FIGS. 3a-b are cross-sectional perspective views of an integrated circuit structure having first and second fin types (p-type and n-type) and after epitaxial source/drain regions have been formed on those fins, wherein the source/drain regions on the second fin type remain blocked off with insulator material while the source/drain regions on the first fin type have contacts of a first type formed thereon, in accordance with an embodiment of the present disclosure.

With further reference to FIG. 1, the method then continues at 114 with forming NMOS and PMOS transistors, which may include, for instance, formation of a gate structure (which may be formed using a gate-last process flow where a sacrificial dummy gate structure is initially formed and then replaced with a final gate structure after the source/drain regions are formed, or a gate-first process flow which avoids the sacrificial dummy gate processing), etch and replace of the source/drain regions, and formation of the final gate structure (for gate-last process flows). FIG. 3a shows the resulting structure after a final gate structure 360 is formed, wherein gate dielectric and electrode materials are deposited over the channel regions of the fins, in accordance with some embodiments. During gate structure processing, once the channel region of the fin is exposed, but prior to deposition of the final gate materials, the channel region can be processed as desired (e.g., thinned, shaped, cladded, formed into one or more nanowires, etc). FIG. 3a also shows example epitaxial source/drain regions 365 and 367 that have been provisioned. In other embodiments, the source/drain regions 365 and 367 are doped portions of the fin material in the corresponding source/drain regions. In either case, source/drain regions 365 can be a first type (e.g., p-type) and source/drain regions 367 can be a second type (e.g., n-type). In this example case, note the isolation walls (232 and 234) are just as tall or taller than the tops of the epitaxial source/drain regions 365 and 367 to facilitate isolation of the p-type source/drain regions and the n-type source/drain regions.

The gate structure 360 can be implemented with any suitable processes and materials. For instance, the gate structure 360 may include gate spacers, a gate dielectric, and a gate electrode. The gate structure may further include a hard mask on top of the gate electrode (and any exposed gate dielectric). Any number of gate structure configurations can be used. The gate spacers may be, for example, silicon nitride or silicon dioxide. The gate dielectric may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrode may comprise a wide range of suitable metals or metal alloys, such as aluminum, tungsten, titanium, tantalum, copper, titanium nitride, or tantalum nitride, for example. In some embodiments, the gate dielectric and/or gate electrode may include a multilayer structure of two or more material layers or components. For instance, in one such embodiment, the gate dielectric is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric and/or gate electrode may include grading (increasing or decreasing, as the case may be) of the concentration of one or more materials therein. Numerous different gate structure configurations can be used, as will be apparent in light of this disclosure.

In some embodiments fabricated using a gate-last process and having epitaxial source/drain regions, source/drain region recesses are formed adjacent the channel region, after a dummy gate structure is provided (e.g., polysilicon gate electrode, silicon dioxide gate dielectric, and silicon nitride gate spacers). In other embodiments having a gate-first process and epitaxial source/drain regions, however, the source/drain region recesses are formed adjacent the channel region, after that final gate structure is provided (e.g., tungsten gate electrode, hafnium dioxide gate dielectric, and silicon nitride gate spacers). In any case, the source drain region recesses may undercut the gate structure, such that the recesses extend under the gate structure (e.g., under at least one of the gate electrode and/or gate dielectric) in accordance with some embodiments, while in other embodiments there is no such undercut. Any suitable etch can be used to form the source/drain region recesses, including wet and/or dry etches, isotropic and/or anisotropic etches, and selective etch schemes, as will be appreciated. The source/drain materials are then epitaxially deposited to provide source/drain regions 365 and 367. In some cases, the source/drain material deposition grows out of a trench or otherwise from the underlying semiconductor fin material to provide faceted or otherwise raised source/drain regions, as generally shown in FIG. 3a. The previously noted example source/drain materials and structures can be used, and may be provisioned with in situ doping. In a more general sense, any suitable source/drain materials and structures and processing can be used, as will be appreciated. After the source/drain regions 365 and 367 are formed, insulator material is deposited and planarized to provide a structure ready for source/drain contact formation. This insulator material is designated as 363 in FIG. 3a, and is shown in a partially etched state during the source/drain contact processing, as will now be explained With further reference to FIG. 1, the method then continues at 115 with patterning and opening a source/drain contact trench to expose a first type (n-type or p-type) of source/drain regions. Note that there may be multiple source/drain contact trenches that are opened at once. Further note that, according to some embodiments, there are at least two isolation walls exposed in each trench that is opened, even if only a single type source/drain region is exposed in the that trench. Any suitable patterning and etch schemes (e.g., wet and/or dry etching) or selective etch schemes (e.g., selective to gate materials so as to only remove insulator material over source/drain regions) can be used. If multiple source/drain types (e.g., p-type and n-type) are to exist within a common trench, further note that the opened trench may be a partial trench, wherein other source/drain regions to be included in the trench remain temporarily covered with insulator material until after the first type of contact structure is formed. In such cases, the insulator material used to planarize the structure after the source/drain regions are formed at 114 further acts as a blocking layer during contact formation as will be explained in turn (e.g., block the n-type source/drain regions if the source/drain regions targeted for contact formation are p-type, or vice-versa). The insulator (or blocking) material can be any suitable insulator material, such as silicon dioxide or some other insulator material that can be used to planarize the structure after the source/drain regions are formed at 114.

FIG. 3a shows the resulting structure after a number of trenches have been opened in insulator 363 to expose a first type of source/drain regions 365 (e.g., p-type). Insulator material 363 is left as a blocking layer on a second type of source/drain regions 367 (e.g., n-type). The insulator 363 can be patterned using any suitable techniques, including standard lithography (e.g., patterning a mask and etching to expose the target underlying source/drain regions). Note that, although not yet apparent in FIG. 3a, the five right-most source/drain regions (including three source/drain regions 365 and two source/drain regions 367, will all be in the same contact trench (as better shown in FIG. 3b) after source/drain contact processing is completed. In addition, the left-most source/drain region 365 will be in its own contact trench, as will be the left-most source/drain region 367. So, there are three distinct contact trenches that will be formed in this example embodiment, for the perspective cross-section view depicted: a first trench having both p-type and n-type contact structures, a second trench having only a p-type contact structure, and a third trench having only an n-type contact structure.

Figure 3B:
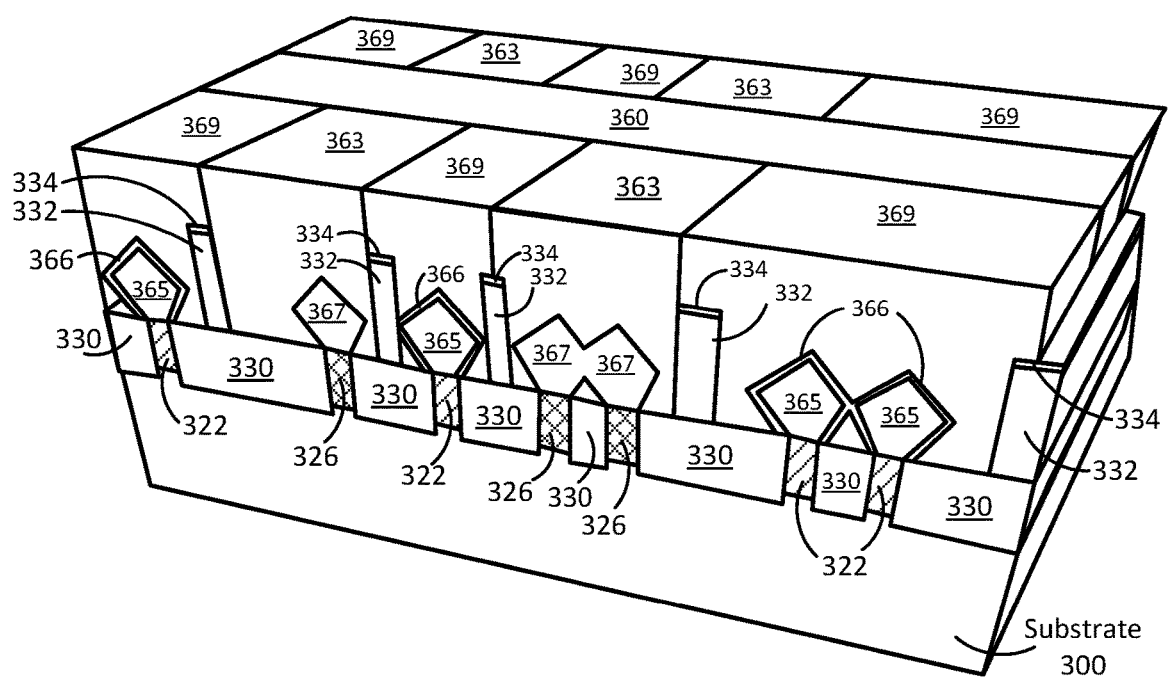

With further reference to FIG. 1, the method then continues at 118 with forming a first type of contact structure(s) in the open trench(es), including resistance reducing material suitable for first source/drain type, and planarizing the resulting structure down to top of gate 360 and insulation 363, to remove excess contact materials thereon. With further reference to FIGS. 3a and 3b, a resistance reducing material 366 is deposited (e.g., any of the resistance-reducing previously provided, or other suitable resistance-reducing material) on source/drain regions 365. Then a plug metal 369 (e.g., any of the plug metals previously provided, or other suitable plug metals) is deposited on the resistance reducing material 366. Note that, although not shown, the resistance reducing material 366 may also deposit on other surfaces exposed in the trench, such as the exposed surfaces of the isolation walls (on low etch rate material 332 and etch resistant cap 334), the top surfaces of STI 330, and sidewalls of insulator 363. The structure is then planarized, where excess contact materials are then removed from the tops of the gate 360 and insulator 363. The planarization further makes the tops of the gate 360, insulator 363, and plug metal 369 co-planar, as generally shown in FIG. 3b.

In such cases where there is a pad or plug of bulk material deposited onto the resistance reducing material, the contact resistance lowering material can be selected to react slightly with the underlying source/drain region material, but the plug or bulk of the contact structure can be a less reactive material. In other embodiments, the entire contact structure can be the resistance reducing material 366. The previous discussion with respect to different types of resistance reducing materials and plug materials for p-type and n-type source/drain regions is equally applicable here. In some embodiments, note that there may also be a diffusion barrier such as titanium nitride or tantalum nitride between the resistance reducing layer 366 and the plug 369. Any number of contact structures and configurations can be used, as will be appreciated.

With further reference to FIG. 1, the method continues at 120 with patterning and opening a source/drain contact trench to expose a second type (p-type or n-type) of source/drain regions (again, there may be multiple such contact trenches). Note that, in some locations, the trench being formed may be a second portion of a trench initially opened at 116. For instance, in FIG. 3c, note that the remaining insulator material 363 between the right-most two contact structures is now removed, thereby exposing the underlying source/drain regions 367 (which are joined in this particular example embodiment). In such locations, there will be one large contact structure within the same trench, but that contact structure nonetheless has distinct contact material over p-type and n-type source/drain regions as variously provided herein. In other locations, the trench may be a single source/drain region trench that is patterned into insulator 363, such as the left-most occurrence of source/drain region 367 (note insulator 363 remaining on either side of the source/drain region 367). Further note that any etch used to remove the insulator 363 is selective to the isolation wall materials (332 and 334) as well as the source/drain region materials (365 and 367).

Figure 3C:
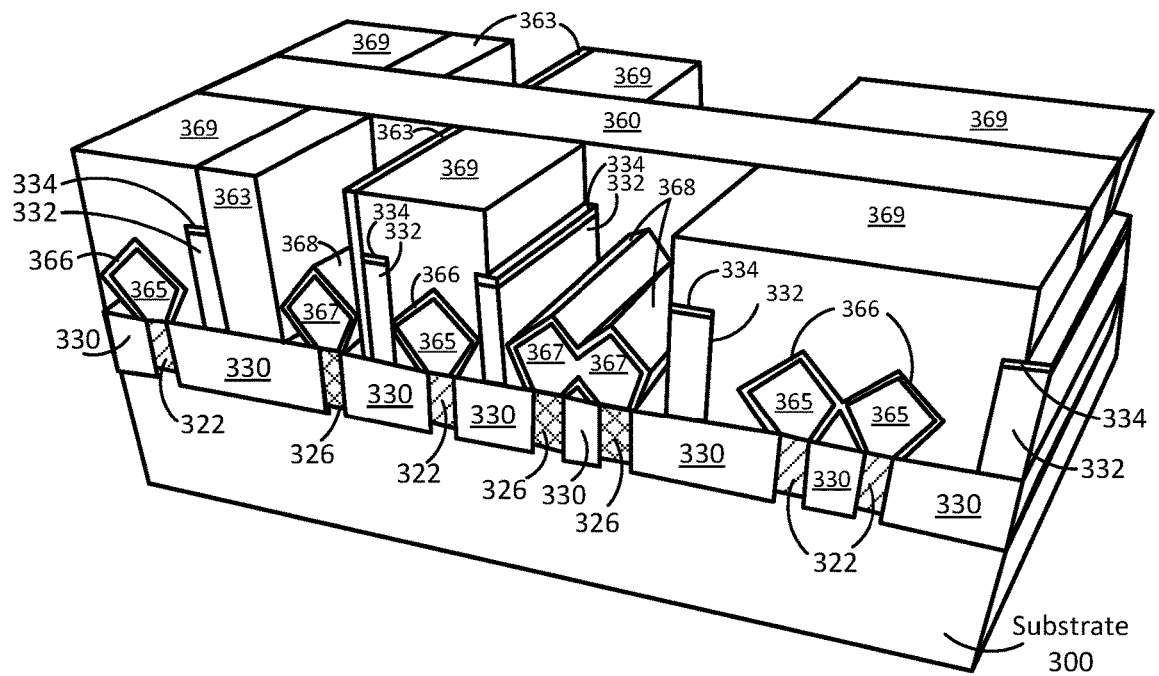
FIGS. 3c-d are cross-sectional perspective views of the integrated circuit structure of FIGS. 3a-b, wherein the source/drain regions on the second fin type are now exposed to have contacts of a second type formed thereon, in accordance with an embodiment of the present disclosure.
Figure 3D:
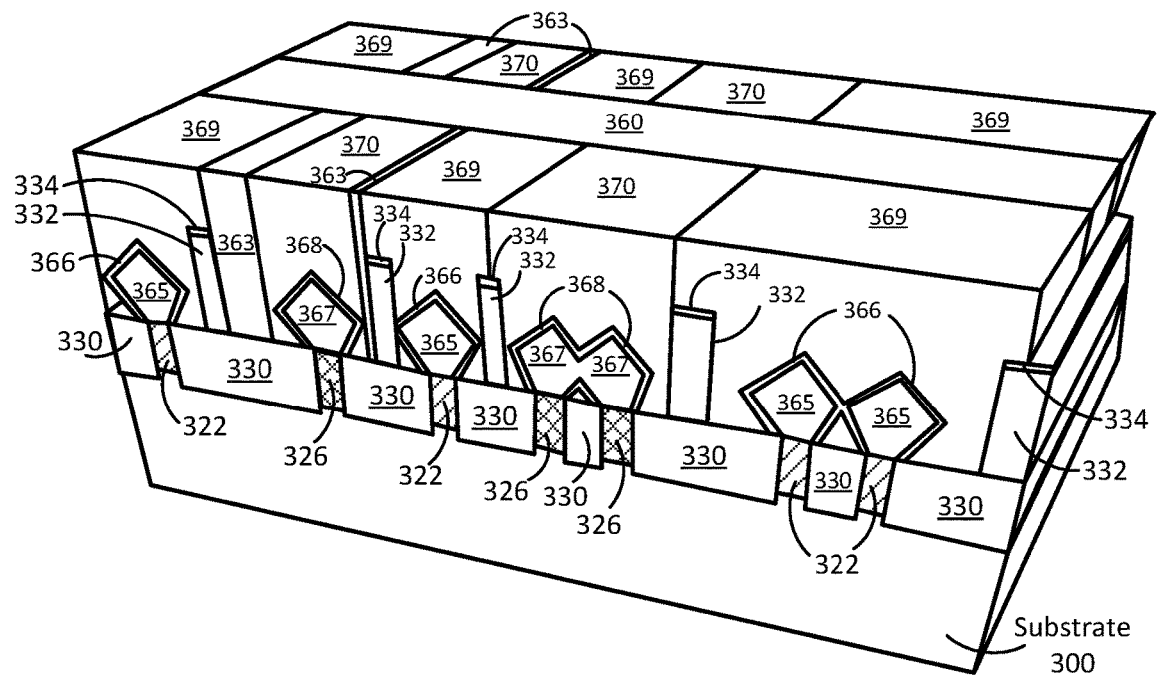

With further reference to FIG. 1, the method then continues at 122 with forming second type contact structure(s) in the open trench(es), including resistance reducing material suitable for second type source/drain regions, and planarizing the resulting structure down to top of gate 360 and insulation 363, to remove excess contact materials thereon. With further reference to FIGS. 3c and 3d, a resistance reducing material 368 is deposited (e.g., any of the resistance-reducing previously provided, or other suitable resistance-reducing material) on source/drain regions 367. Then a plug metal 3370 (e.g., any of the plug metals previously provided, or other suitable plug metals) is deposited on the resistance reducing material 368. Note that, although not shown, the resistance reducing material 368 may also deposit on other surfaces exposed in the trench, such as the exposed surfaces of the isolation walls (on low etch rate material 332 and etch resistant cap 334), the top surfaces of STI 330, and sidewalls of insulator 363. The structure is then planarized, where excess contact materials are then removed from the tops of the gate 360 and insulator 363. The planarization further makes the tops of the gate 360, insulator 363, plug metal 369, and plug metal 370 co-planar, as generally shown in FIG. 3d. The previously provided example source/drain region materials and contact structure materials is equally applicable here.

FIG. 3d shows the resulting structure, having three distinct trenches. The first or left-most contact trench has a first type contact structure only (366 and 369 on a source/drain region 365). The second or next contact trench (moving from left to right) has a second type of contact structure (368 and 370) over the second type of source/drain regions 367. The third or right-most contact trench has both the first type of contact structure (366 and 369) over the first type of source/drain regions 365, and the second type of contact structure (368 and 370) over the second type of source/drain regions 367. In the third contact trench, note how the plug metal 369 and 370 are shorted together over the two intervening isolation walls. Further note that those two isolation walls each has first and second sidewalls, the first sidewall being in direct contact with plug 369 and a second sidewall being in direct contact with plug 370.

With further reference to FIG. 1, the method continues at 125 with completing the integrated structure formation process, as needed. This completion may include, for example, the formation of one or more interconnect layers or any other features. Numerous configurations and embodiments will be apparent.

Figure 4A:
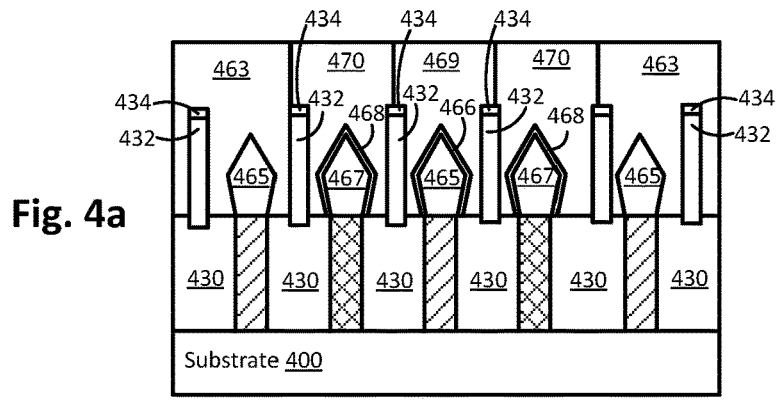
FIGS. 4a-4d collectively illustrate cross-sectional views of an integrated circuit structure having both p-type and n-type source/drain contact structures within a common contact trench that spans both p-type and n-type fins (FIGS. 4a and 4c) as well as a dedicated contact trench with only one fin type (FIG. 4b), in accordance with an embodiment of the present disclosure.
Figure 4B:
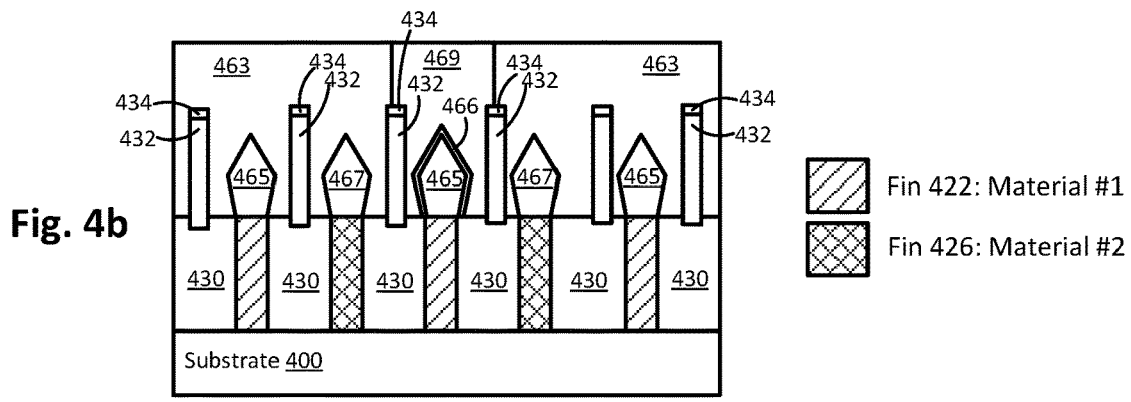
Figure 4C:
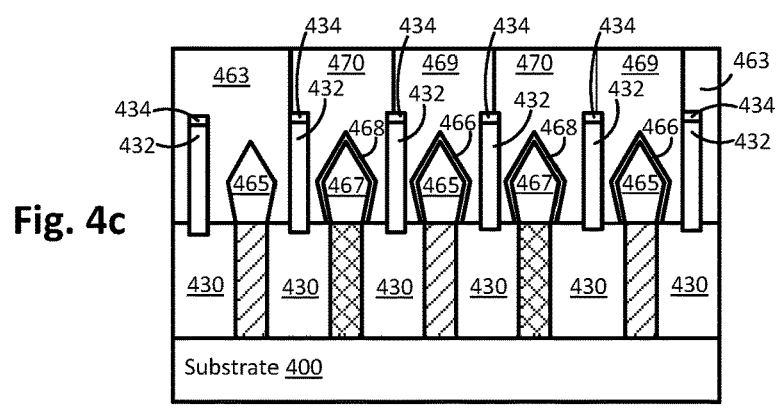
Figure 4D:
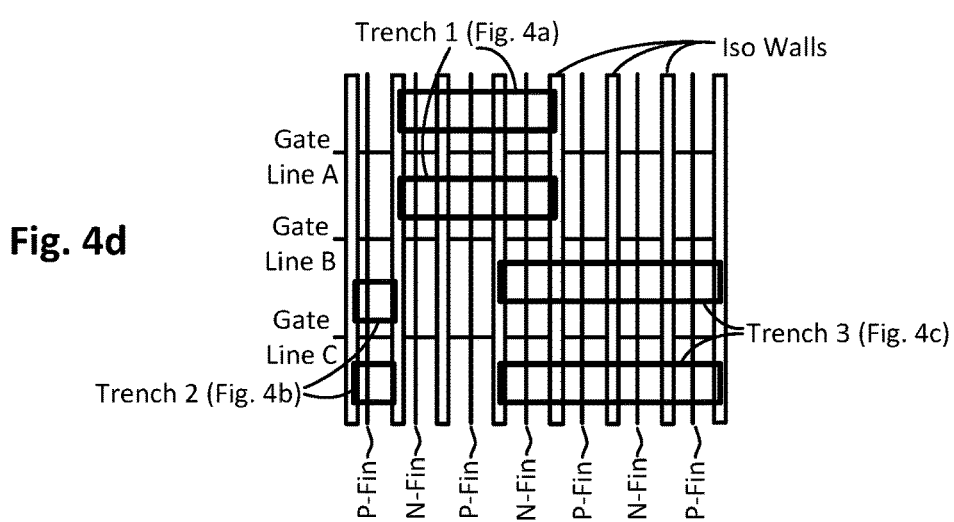

FIGS. 4a-4d collectively illustrate cross-sectional views of an integrated circuit structure having both p-type and n-type source/drain contact structures within a common contact trench that spans both p-type and n-type fins (FIGS. 4a and 4c) as well as a dedicated contact trench with only one fin type (FIG. 4b), in accordance with an embodiment of the present disclosure. As will be appreciated, FIG. 4d shows a top down view of the cross-section views shown in FIGS. 4a-c. As can be seen, the example layout of FIG. 4d includes three example contact trench configurations (generally designated as trench 1, trench 2, and trench 3).

Details of trench 1 are shown in the cross-section of FIG. 4a. As can be seen, trench 1 spans three fins, including fin 422 (material #1, such as germanium) and fins 426 (material #2, such as indium gallium arsenide). There is an isolation wall (432 and 434) between each of the fins in this example case. Source/drain region 465 is provided on fin 422 and source/drain regions 467 are provided on fins 426. The contact structure on the source/drain region 465 includes a resistance reducing layer 466 and a plug 469, and the contact structures on the source/drain regions 467 include a resistance reducing layer 468 and a plug 470. In some such embodiments, the resistance reducing layer 466 is different from the resistance reducing layer 468, but the plugs 469 and 470 are the same. In other embodiments, the plug 469 is different from the plug 470, but the resistance reducing layers 466 and 468 are the same. In still other embodiments, the plug 469 is different from the plug 470, and the resistance reducing layer 466 is different from the resistance reducing layer 468. Any additional contact structure materials, such as adhesion layers and barrier layers, may also be diverse with respect to different source/drain types. In any such cases, note that the contact structure may be electrically shorted to one another, within the given trench. Further note that the outer-most source/drain regions 465 are covered with insulator 463, and may either be subjected to contact processing at a later time or left as-is (dummy source/drain regions that are not connected).

Details of trench 2 are shown in the cross-section of FIG. 4b. As can be seen, trench 2 spans a single fin 422. There is an isolation wall (432 and 434) to either side of the fin in this example case. Source/drain region 465 is provided on fin 422. The contact structure on the source/drain region 465 includes a resistance reducing layer 466 and a plug 469. As will be appreciated, the neighboring source/drain regions 467 may also be processed to have a dedicated contact trench with only a single type of contact structure therein.

However, just as within trench 1 of FIG. 4a, the contact structure over source/drain regions 465 is still different from the contact structure over source/drain regions 467 (e.g., such as compositionally different resistance reducing materials, or compositionally different plug materials, etc, as explained above). Materials that are compositionally different as used herein refers to two materials that have different chemical compositions. This compositional different may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or different the same dopants but at differing concentrations.

Details of trench 3 are shown in the cross-section of FIG. 4c. As can be seen, trench 3 spans four fins, including fins 422 (material #1) and fins 426 (material #2). There is an isolation wall (432 and 434) between each of the fins in this example case. Source/drain regions 465 are provided on fins 422 and source/drain regions 467 are provided on fins 426. The contact structures on the source/drain regions 465 include a resistance reducing layer 466 and a plug 469, and the contact structures on the source/drain regions 467 include a resistance reducing layer 468 and a plug 470. As will be appreciated in light of this disclosure, the contact structure over source/drain regions 465 is different from the contact structure over source/drain regions 467 (e.g., such as different resistance reducing materials, or different plug materials, etc, as explained above). Further note that the source/drain structures within trench 3 are shorted together over the isolation walls.

Note that each of trenches 1, 2, and 3 include an isolation wall at opposing ends of the trench, according to an embodiment. Further note that some of the source/drain regions remain covered by insulator material, and can be processed later in the process using yet another contact trench, or simply left as is. Numerous transistor configurations and suitable fabrication processes will be apparent in light of this disclosure, including any number of non-planar transistor structures (e.g., such as double-gate and tri-gate transistor structures, and nanowire and nano-ribbon transistor or so-called gate-all-around structures), as well as strained and unstrained channel structures. Any number of such structural features and material systems can be used in conjunction with a diverse source/drain contact structure materials. In some example embodiments, the transistor structure includes dopant-implanted source/drain regions or epitaxial replacement source/drain regions.

Example System

Figure 5:
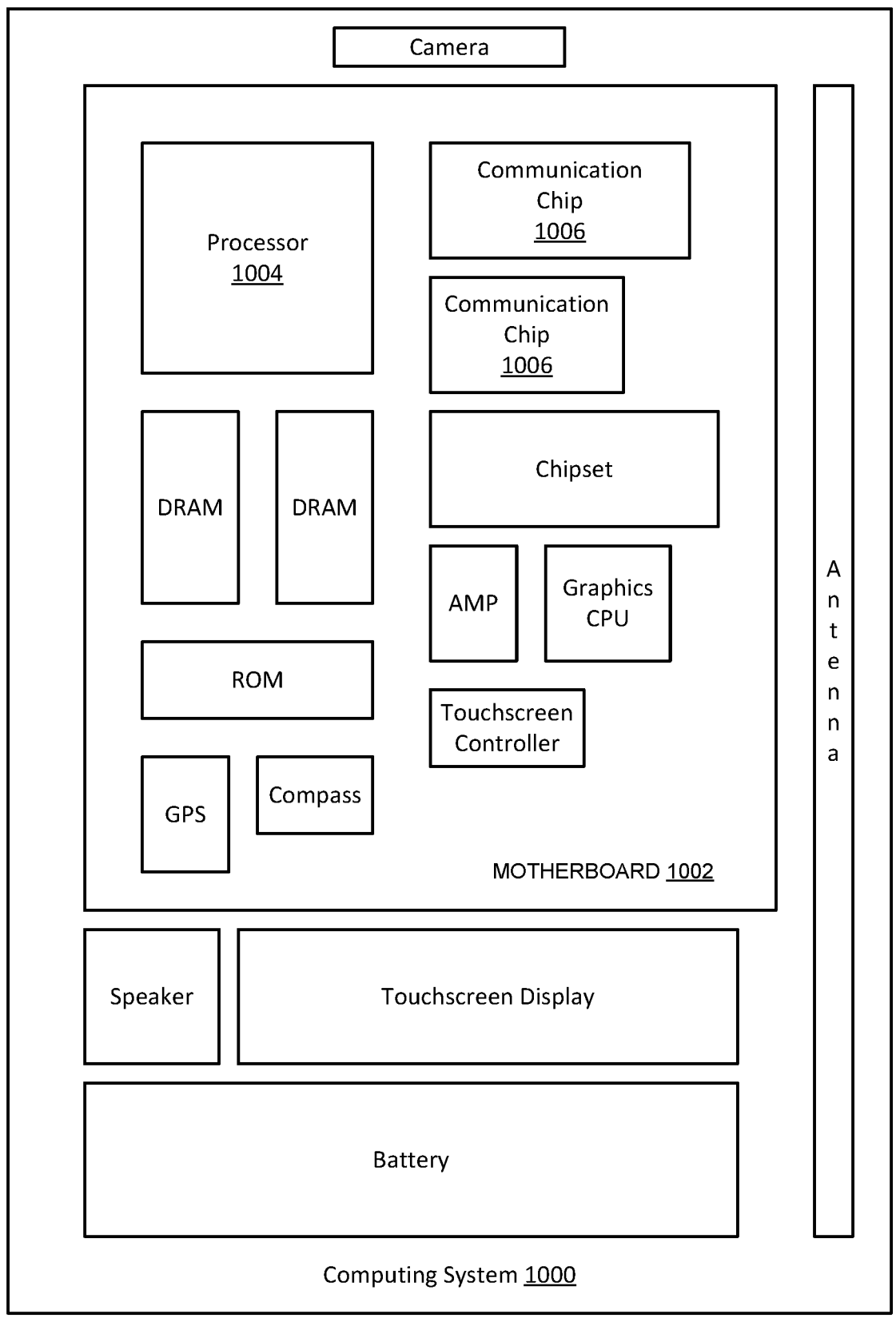
FIG. 5 illustrates a computing system implemented with one or more integrated circuit structures configured in accordance with an embodiment of the present disclosure.

FIG. 5 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit CMOS structures configured with transistors having diverse contact structures for p-type and n-type source drain regions. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes transistors having diverse contact structures for p-type and n-type source drain regions. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more replacement fin-based transistors as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs transistors having diverse contact structures for p-type and n-type source drain regions. As will be appreciated in light of this disclosure, various embodiments of the present disclosure can be used to improve performance on products fabricated at any process node (e.g., in the micron range, or sub-micron and beyond) by allowing for the use of non-planar transistors having high mobility customized and diverse channel configurations (e.g., Si, Ge, SiGe, multilayer structure of Si and SiGe, III-V, and/or combinations thereof) on the same die.

Further Example Embodiments

The following examples pertain to further embodiments, from which numerous permutations and configurations will be apparent.

Example 1 includes an integrated circuit structure, comprising: a non-planar PMOS transistor including a first source region and a first drain region, and a first contact structure on one of the first source region or the first drain region, the first contact structure including a first material; a non-planar NMOS transistor including a second source region and a second drain region, and a second contact structure on one of the second source region or drain region, the second contact structure including a second material having a chemical composition that is different from that of the first material; and an isolation structure between the non-planar PMOS and NMOS transistors and physically separating the first and second source regions or the first and second drain regions.

Example 2 includes the subject matter of Example 1, wherein: the non-planar PMOS transistor further includes a first body of semiconductor material between the first source region and the first drain region, and a first gate structure on multiple sides of the first body; and the non-planar NMOS transistor further includes a second body of semiconductor material between the second source region and the second drain region, and a second gate structure on multiple sides of the second body of semiconductor material.

Example 3 includes the subject matter of Example 1 or 2, wherein the non-planar PMOS transistor and the non-planar NMOS transistor are tri-gate FinFETs, or nanowire FinFETs, or a combination of a tri-gate FinFET and as nanowire FinFET.

Example 4 includes the subject matter of Example 2 or 3, wherein one or both of the first and second semiconductor bodies is a fin structure, and the corresponding gate structure has a double-gate or tri-gate configuration.

Example 5 includes the subject matter of any of Examples 2 through 4, wherein one or both of the first and second semiconductor bodies comprises a nanowire or a nanoribbon, and the corresponding gate structure has a gate-all-around configuration.

Example 6 includes the subject matter of any of Examples 2 through 5, wherein each of the first and second gate structures include a gate electrode and a gate dielectric between the gate electrode and the corresponding fin, the gate dielectric comprising a high-k dielectric material.

Example 7 includes the subject matter of Example 6, wherein at least one of the gate electrodes includes a first electrode material and a second electrode material distinct from the first electrode material.

Example 8 includes the subject matter of any of Examples 1 through 7, wherein the first source region, the first drain region, and a semiconductor body between the first source region and first drain region each comprise germanium at a concentration in excess of 50 atomic percent, and the first material of the first contact structure comprises one or more of nickel, platinum, cobalt, titanium, and nitrogen.

Example 9 includes the subject matter of Example 8, wherein the first material of the first contact structure is a first layer, the first contact structure further including a second layer comprising one or more of tungsten, aluminum, ruthenium, cobalt, and copper, wherein the second layer is thicker than the first layer.

Example 10 includes the subject matter of Example 9, wherein the first contact structure further includes a third layer between the first and second layers, the third layer comprising one or more of tantalum and nitrogen.

Example 11 includes the subject matter of any of Examples 8 through 10, wherein the germanium concentrations for each of the first source region, the first drain region, and the semiconductor body is in the range of 70 to 100 atomic percent.

Example 12 includes the subject matter of any of Examples 8 through 11, wherein the semiconductor body is a bulk body of germanium, and the first source region and the first drain region comprise germanium and silicon.

Example 13 includes the subject matter of any of Examples 1 through 7, wherein a semiconductor body between the second source region and second drain region comprises germanium at a concentration in excess of 50 atomic percent, and the second material of the second contact structure comprises one or more of antimony, indium, arsenic, and scandium.

Example 14 includes the subject matter of Example 13, wherein the second material of the second contact structure is a first layer, the second contact structure further including a second layer comprising one or more of tungsten, aluminum, ruthenium, cobalt, and copper, wherein the second layer is thicker than the first layer.

Example 15 includes the subject matter of Example 14, wherein the second contact structure further includes a third layer between the first and second layers, the third layer comprising an insulator material.

Example 16 includes the subject matter of any of Examples 13 through 15, wherein each of the second source region and the second drain region has a germanium concentration in the range of 0 to 30 atomic percent.

Example 17 includes the subject matter of any of Examples 13 through 16, wherein the semiconductor body is a bulk body of germanium.

Example 18 includes the subject matter of any of Examples 1 through 7, wherein a semiconductor body between the second source region and second drain region comprises a group III-V semiconductor material, and the second material of the second contact structure comprises one or more of germanium, nickel, gold, platinum, and titanium.

Example 19 includes the subject matter of Example 18, wherein the second material of the second contact structure is a first layer, the second contact structure further including a second layer comprising one or more of tungsten, aluminum, ruthenium, cobalt, and copper, wherein the second layer is thicker than the first layer.

Example 20 includes the subject matter of Example 19, wherein the second contact structure further includes a third layer between the first and second layers, the third layer comprising one or more of tantalum and nitrogen.

Example 21 includes the subject matter of any of Examples 18 through 20, wherein each of the second source region and the second drain region comprises two or more of indium, aluminum, arsenic, phosphor, gallium, and antimony.

Example 22 includes the subject matter of any of Examples 18 through 21, wherein the semiconductor body comprises two or more of indium, gallium, arsenic, and antimony.

Example 23 includes the subject matter of any of Examples 1 through 7, wherein a first semiconductor body between the first source region and the first drain region comprises a first two-dimensional semiconductor material, and wherein a second semiconductor body between the second source region and the second drain region comprises a second two-dimensional semiconductor material, and the first and second materials of the first and second contact structures, respectively comprise one or more of nickel, titanium, gold, silver, aluminum, scandium, yttrium, zirconium, and platinum.

Example 24 includes the subject matter of Example 23, wherein the second material of the second contact structure is a first layer, the second contact structure further including a second layer comprising one or more of tungsten, aluminum, ruthenium, cobalt, and copper, wherein the second layer is thicker than the first layer.

Example 25 includes the subject matter of Example 24, wherein the second contact structure further includes a third layer between the first and second layers, the third layer comprising one or more of tantalum and nitrogen.

Example 26 includes the subject matter of any of Examples 23 through 25, wherein one or more of the first source region, the first drain region, the second source region, the second drain region, the first semiconductor body, and the second semiconductor body comprises a transition metal dichalcogenide.

Example 27 includes the subject matter of any of Examples 23 through 26, wherein one or more of the first source region, the first drain region, the second source region, the second drain region, the first semiconductor body, and the second semiconductor body comprises graphene.

Example 28 includes the subject matter of any of Examples 1 through 27, wherein the first contact structure is shorted to the second contact structure proximate a top of the isolation structure.

Example 29 includes the subject matter of any of Examples 1 through 28, wherein the non-planar PMOS transistor comprises a first semiconductor fin and the non-planar NMOS transistor comprises a second semiconductor fin, the integrated circuit structure further comprising insulator material separating the first and second semiconductor fins, the isolation structure being distinct from and extending from the insulator material and between the first and second contact structures.

Example 30 includes the subject matter of Example 29, wherein the insulation material is an oxide, and the isolation structure comprises a carbide or a nitride or both.

Example 31 includes the subject matter of Example 29 or 30, wherein the isolation structure comprises a metal-containing cap on a carbide or nitride body.

Example 32 includes an integrated circuit, comprising: a first semiconductor fin structure, a second semiconductor fin structure, and an insulation material between the first and second semiconductor fin structures; a first gate structure on a portion of the first semiconductor fin structure; a first source region and a first drain region each including a p-type impurity, the portion of the first semiconductor fin structure being between the first source region and the first drain region; a first contact structure on one of the first source region or the first drain region, the first contact structure including a first material; a second gate structure on a portion of the second semiconductor fin structure; a second source region and a second drain region each including an n-type impurity, the portion of the second semiconductor fin structure being between the second source region and the second drain region; a second contact structure on one of the second source region or the second drain region, the second contact structure including a second material having a chemical composition that is different from that of the first material; and an isolation wall between the first and second contact structures, the isolation wall at least partially in the insulation material.

Example 33 includes the subject matter of Example 32, wherein the portion of the first semiconductor fin structure that is between the first source region and the first drain region includes one or more nanowires or nanoribbons, and the first gate structure has a gate-all-around configuration.

Example 34 includes the subject matter of Example 32 or 33, wherein the portion of the second semiconductor fin structure that is between the second source region and the second drain region includes one or more nanowires or nanoribbons, and the second gate structure has a gate-all-around configuration.

Example 35 includes the subject matter of any of Examples 32 through 34, wherein each of the first and second gate structures include a gate electrode and a gate dielectric between the gate electrode and the corresponding portion of the first or second semiconductor fin structures, the gate dielectric comprising a high-k dielectric material.

Example 36 includes the subject matter of Example 35, wherein at least one of the gate electrodes includes a first electrode material and a second electrode material distinct from the first electrode material.

Example 37 includes the subject matter of any of Examples 32 through 36, wherein: the portion of the first semiconductor fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and the portion of the second semiconductor fin structure that is between the second source region and the second drain region is germanium, and the second source region and the second drain region comprise germanium at a concentration of less than 30 atomic percent, and the second material of the second contact structure comprises one or more of antimony, indium, arsenic, and scandium.

Example 38 includes the subject matter of Example 37, wherein each of the first material of the first contact structure and the second material of the second contact structure is a first layer, each of the first and second contact structures further including a second layer comprising one or more of tungsten, aluminum, ruthenium, cobalt, and copper, wherein the second layer is thicker than the first layer.

Example 39 includes the subject matter of any of Examples 32 through 36, wherein: the portion of the first semiconductor fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and the portion of the second semiconductor fin structure that is between the second source region and the second drain region comprises a first group III-V semiconductor material, and the second source region and the second drain region comprise a second group III-V semiconductor material compositionally different from the first group III-V semiconductor material, and the second material of the second contact structure comprises one or more of germanium, nickel, gold, platinum, and titanium.

Example 40 includes the subject matter of Example 39, wherein each of the first material of the first contact structure and the second material of the second contact structure is a first layer, each of the first and second contact structures further including a second layer comprising one or more of tungsten, aluminum, ruthenium, cobalt, and copper, wherein the second layer is thicker than the first layer.

Example 41 includes the subject matter of Example 39 or 40, wherein each of the second source region and the second drain region comprises two or more of indium, aluminum, arsenic, phosphor, gallium, and antimony, and the second semiconductor fin structure comprises two or more of indium, gallium, arsenic, and antimony.

Example 42 includes the subject matter of any of Examples 32 through 36, wherein: the portion of the first semiconductor fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and each of the second source region, the second drain region, and the portion of the second semiconductor fin structure that is between the second source region and the second drain region comprises one or more two-dimensional semiconductor materials, and the second material of the second contact structure comprises one or more of nickel, titanium, gold, silver, aluminum, scandium, yttrium, zirconium, and platinum.

Example 43 includes the subject matter of Example 42, wherein each of the first material of the first contact structure and the second material of the second contact structure is a first layer, each of the first and second contact structures further including a second layer comprising one or more of tungsten, aluminum, ruthenium, cobalt, and copper, wherein the second layer is thicker than the first layer.

Example 44 includes the subject matter of any of Examples 32 through 36, wherein one or more of the first source region, the first drain region, and the portion of the first semiconductor fin structure that is between the first source region and the first drain region, as well as the second source region, the second drain region, and the portion of the second semiconductor fin structure that is between the second source region and the second drain region, comprises one or more two-dimensional semiconductor materials, and one or both of the first and second materials of the first and second contact structures, respectively, comprises one or more of nickel, titanium, gold, silver, aluminum, scandium, yttrium, zirconium, and platinum.

Example 45 includes the subject matter of Example 44, wherein each of the first material of the first contact structure and the second material of the second contact structure is a first layer, each of the first and second contact structures further including a second layer comprising one or more of tungsten, aluminum, ruthenium, cobalt, and copper, wherein the second layer is thicker than the first layer.

Example 46 includes the subject matter of Example 44 or 45, wherein one or more of the first source region, the first drain region, and the portion of the first semiconductor fin structure that is between the first source region and the first drain region, as well as the second source region, the second drain region, and the portion of the second semiconductor fin structure that is between the second source region and the second drain region, comprises a transition metal dichalcogenide.

Example 47 includes the subject matter of any of Examples 44 through 46, wherein one or more of the first source region, the first drain region, and the portion of the first semiconductor fin structure that is between the first source region and the first drain region, as well as the second source region, the second drain region, and the portion of the second semiconductor fin structure that is between the second source region and the second drain region, comprises graphene.

Example 48 includes the subject matter of any of Examples 32 through 47, wherein the first contact structure is shorted to the second contact structure proximate a top of the isolation wall.

Example 49 includes the subject matter of any of Examples 32 through 48, wherein the insulation material is an oxide, and the isolation wall comprises a carbide or a nitride.

Example 50 includes the subject matter of Example 49, wherein the isolation wall further comprises a metal-containing cap on the carbide or nitride.

Example 51 is a method for forming an integrated circuit, the method comprising: forming first and second semiconductor fins; forming an isolation structure between the first and second semiconductor fins, the isolation structure including a body of a first insulator material having an isolation wall formed therein, the isolation wall comprising a body of a second insulator material distinct from the first insulator material, the body having first and second sidewalls; forming an NMOS transistor structure on the first semiconductor fin, and a PMOS transistor structure on the second semiconductor fin, each of the NMOS and PMOS transistor structures including a gate structure, a source region, and a drain region; etching a first contact trench to expose the source region or the drain region of one of the NMOS and PMOS transistor structures, wherein the etching is selective to the isolation wall, the etching further exposing a first sidewall of the isolation wall; forming a first contact structure in the first contact trench on the source region or drain region exposed therein, the first contact structure in contact with the first sidewall of the isolation wall; and etching a second contact trench to expose the source region or the drain region of the other one of the NMOS and PMOS transistor structures, wherein the etching is selective to the isolation wall, the etching further exposing second sidewall of the isolation wall; forming a second contact structure in the second contact trench on the source region or drain region exposed therein, the second contact structure in contact with the second sidewall of the isolation wall.

Example 52 includes the subject matter of Example 51, wherein the first contact structure is shorted to the second contact structure proximate a top of the isolation wall.

Example 53 includes the subject matter of Example 51, wherein the first contact structure is electrically isolated from the second contact structure by the isolation wall and additional insulator material adjacent a top of the isolation wall.

Example 54 includes the subject matter of any of Examples 51 through 53, wherein forming the first and second semiconductor fins includes a first phase where fins native to an underlying substrate are formed and a second phase where at least some of the native fins are at least partially removed by a fin etch process that leaves a trench in which a semiconductor material distinct from the underlying substrate is deposited to thereby form replacement fins.

Example 55 includes the subject matter of Example 54, wherein forming the isolation structure occurs between the first and second phases.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:
1. An integrated circuit structure, comprising:
a non-planar PMOS transistor including a first source region and a first drain region, and a first contact structure on one of the first source region or the first drain region, the first contact structure including a first material;
a non-planar NMOS transistor including a second source region and a second drain region, and a second contact structure on one of the second source region or drain region, the second contact structure including a second material having a chemical composition that is different from that of the first material, and the second contact structure in direct physical contact with the first contact structure; and
an isolation structure between the non-planar PMOS and NMOS transistors and physically separating the first and second source regions or the first and second drain regions.

2. The integrated circuit structure of claim 1, wherein:
the non-planar PMOS transistor further includes a first body of semiconductor material between the first source region and the first drain region, and a first gate structure on multiple sides of the first body; and
the non-planar NMOS transistor further includes a second body of semiconductor material between the second source region and the second drain region, and a second gate structure on multiple sides of the second body;
wherein each of the first and second gate structures include a gate electrode and a gate dielectric between the gate electrode and the corresponding body, the gate dielectric comprising a high-k dielectric material.

3. The integrated circuit structure of claim 1, wherein the first source region, the first drain region, and a semiconductor body between the first source region and first drain region each comprise germanium at a concentration in excess of 50 atomic percent, and the first material of the first contact structure comprises one or more of nickel, platinum, cobalt, titanium, and nitrogen.

4. The integrated circuit structure of claim 3, wherein the first material of the first contact structure is a first layer, the first contact structure further including a second layer comprising one or more of tungsten, aluminum, ruthenium, cobalt, and copper, wherein the second layer is thicker than the first layer.

5. The integrated circuit structure of claim 3, wherein the semiconductor body is a bulk body of germanium, and the first source region and the first drain region comprise germanium and silicon.

6. An integrated circuit structure, comprising:
a non-planar PMOS transistor including a first source region and a first drain region, and a first contact structure on one of the first source region or the first drain region, the first contact structure including a first material;
a non-planar NMOS transistor including a second source region and a second drain region, and a second contact structure on one of the second source region or drain region, the second contact structure including a second material having a chemical composition that is different from that of the first material; and
an isolation structure between the non-planar PMOS and NMOS transistors and physically separating the first and second source regions or the first and second drain regions,
wherein a semiconductor body between the second source region and second drain region comprises germanium at a concentration in excess of 50 atomic percent, and the second material of the second contact structure comprises one or more of antimony, indium, arsenic, and scandium.

7. The integrated circuit structure of claim 6, wherein the second material of the second contact structure is a first layer, the second contact structure further including a second layer comprising one or more of tungsten, aluminum, ruthenium, cobalt, and copper, wherein the second layer is thicker than the first layer.

8. The integrated circuit structure of claim 7, wherein the second contact structure further includes a third layer between the first and second layers, the third layer comprising an insulator material.

9. The integrated circuit structure of claim 6, wherein each of the second source region and the second drain region has a germanium concentration in the range of 0 to 30 atomic percent.

10. The integrated circuit structure of claim 6, wherein the semiconductor body is a bulk body of germanium.

11. The integrated circuit structure of claim 1, wherein a semiconductor body between the second source region and second drain region comprises a group III-V semiconductor material, and the second material of the second contact structure comprises one or more of germanium, nickel, gold, platinum, and titanium.

12. The integrated circuit structure of claim 11, wherein the second material of the second contact structure is a first layer, the second contact structure further including a second layer comprising one or more of tungsten, aluminum, ruthenium, cobalt, and copper, wherein the second layer is thicker than the first layer.

13. The integrated circuit structure of claim 11, wherein each of the second source region and the second drain region comprises two or more of indium, aluminum, arsenic, phosphor, gallium, and antimony, and wherein the semiconductor body comprises two or more of indium, gallium, arsenic, and antimony.

14. The integrated circuit structure of claim 1, wherein a first semiconductor body between the first source region and the first drain region comprises a first two-dimensional semiconductor material, and wherein a second semiconductor body between the second source region and the second drain region comprises a second two-dimensional semiconductor material, and the first and second materials of the first and second contact structures, respectively comprise one or more of nickel, titanium, gold, silver, aluminum, scandium, yttrium, zirconium, and platinum.

15. The integrated circuit structure of claim 14, wherein the second material of the second contact structure is a first layer, the second contact structure further including a second layer comprising one or more of tungsten, aluminum, ruthenium, cobalt, and copper, wherein the second layer is thicker than the first layer.

16. The integrated circuit structure of claim 14, wherein one or more of the first source region, the first drain region, the second source region, the second drain region, the first semiconductor body, and the second semiconductor body comprises a transition metal dichalcogenide.

17. The integrated circuit structure of claim 14, wherein one or more of the first source region, the first drain region, the second source region, the second drain region, the first semiconductor body, and the second semiconductor body comprises graphene.

18. The integrated circuit structure of claim 1, wherein the first contact structure is shorted to the second contact structure proximate a top of the isolation structure.

19. An integrated circuit, comprising:
a first fin structure, a second fin structure, and an insulation material between the first and second fin structures;
a first gate structure on a portion of the first fin structure;
a first source region and a first drain region each including a p-type impurity, the portion of the first fin structure being between the first source region and the first drain region;
a first contact structure on one of the first source region or the first drain region, the first contact structure including a first material;
a second gate structure on a portion of the second fin structure;
a second source region and a second drain region each including an n-type impurity, the portion of the second fin structure being between the second source region and the second drain region;
a second contact structure on one of the second source region or the second drain region, the second contact structure including a second material having a chemical composition that is different from that of the first material, and the second contact structure in direct physical contact with the first contact structure; and
an isolation wall between the first and second contact structures, the isolation wall at least partially in the insulation material.

20. The integrated circuit of claim 19, wherein:
the portion of the first fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and the portion of the second fin structure that is between the second source region and the second drain region is germanium, and the second source region and the second drain region comprise germanium at a concentration of less than 30 atomic percent, and the second material of the second contact structure comprises one or more of antimony, indium, arsenic, and scandium.

21. The integrated circuit of claim 19, wherein:
the portion of the first fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and the portion of the second fin structure that is between the second source region and the second drain region comprises a first group III-V semiconductor material, and the second source region and the second drain region comprise a second group III-V semiconductor material compositionally different from the first group III-V semiconductor material, and the second material of the second contact structure comprises one or more of germanium, nickel, gold, platinum, and titanium.

22. The integrated circuit of claim 19, wherein:
the portion of the first fin structure that is between the first source region and the first drain region is germanium, and the first source region and the first drain region comprise germanium at a concentration in excess of 50 atomic percent, and the first material of the first contact structure comprises one or more of nickel, platinum, cobalt, titanium, and nitrogen; and each of the second source region, the second drain region, and the portion of the second fin structure that is between the second source region and the second drain region comprises one or more two-dimensional semiconductor materials, and the second material of the second contact structure comprises one or more of nickel, titanium, gold, silver, aluminum, scandium, yttrium, zirconium, and platinum.

23. The integrated circuit of claim 19, wherein one or more of the first source region, the first drain region, and the portion of the first fin structure that is between the first source region and the first drain region, as well as the second source region, the second drain region, and the portion of the second fin structure that is between the second source region and the second drain region, comprises one or more two-dimensional semiconductor materials, and one or both of the first and second materials of the first and second contact structures, respectively, comprises one or more of nickel, titanium, gold, silver, aluminum, scandium, yttrium, zirconium, and platinum.

24. The integrated circuit of claim 19, wherein:
the first contact structure is shorted to the second contact structure proximate a top of the isolation wall; and/or
the insulation material is an oxide, and the isolation wall comprises a carbide or a nitride and a metal-containing cap on the carbide or nitride.

25. An integrated circuit, comprising:
a first nanowire, a second nanowire, and an insulation material between the first and second nanowires;
a first gate structure wrapped around at least a portion of the first nanowire;
a first source region and a first drain region each including a p-type impurity, the at least a portion of the first nanowire being between the first source region and the first drain region;
a first contact structure on one of the first source region or the first drain region, the first contact structure including a first material;
a second gate structure wrapped around at least a portion of the second nanowire;
a second source region and a second drain region each including an n-type impurity, the at least a portion of the second nanowire being between the second source region and the second drain region;
a second contact structure on one of the second source region or the second drain region, the second contact structure including a second material having a chemical composition that is different from that of the first material, and the second contact structure in direct physical contact with the first contact structure; and
an isolation wall between the first and second contact structures, the isolation wall at least partially in the insulation material.

* * * * *